United States Patent
Fujimori

(10) Patent No.: US 6,788,567 B2
(45) Date of Patent: Sep. 7, 2004

(54) DATA HOLDING DEVICE AND DATA HOLDING METHOD

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/720,500

(22) Filed: Nov. 24, 2003

(65) Prior Publication Data

US 2004/0105302 A1 Jun. 3, 2004

(30) Foreign Application Priority Data

Dec. 2, 2002 (JP) .................................. 2002-349861
Feb. 4, 2003 (JP) .................................. 2003-027189

(51) Int. Cl.$^7$ .............................................. G11C 11/00
(52) U.S. Cl. ................. 365/154; 365/156; 365/189.05; 365/145; 365/190; 365/185.08
(58) Field of Search ................. 365/154, 156, 365/189.05, 145, 190, 185.08

(56) References Cited

U.S. PATENT DOCUMENTS 5,592,411 A * 1/1997 Tai .............................. 365/145
6,493,267 B2 * 12/2002 Miyamoto et al. ....... 365/185.22
6,707,702 B1 * 3/2004 Komatsuzaki ............... 365/145

FOREIGN PATENT DOCUMENTS

| JP | 05-250881 | 9/1993 |
| JP | 2001-126469 | 5/2001 |

* cited by examiner

*Primary Examiner*—Connie C. Yoha
(74) *Attorney, Agent, or Firm*—Hogan & Hartson, LLP

(57) ABSTRACT

To provide a data holding device and a data holding method with which data can be held even when the power source is interrupted and the held data can be restored accurately, which does not largely increase the circuit area, and which does not require fine timing control. In data restoring operation, a reading signal is applied to the other end 5b of a ferroelectric capacitor 5 with the power source of the data holding device 1 on. An electric charge corresponding to a polarization state stored in the ferroelectric capacitor 5 is thereby discharged to a ferroelectric connecting node 17. At this time, transfer gates 11 and 15 are both off. Thus, the electric charge discharged to the ferroelectric connecting node 17 does not leak through the transfer gates 11 and 15. The potential at the ferroelectric connecting node 17 accurately reflects the discharged electric charge.

22 Claims, 25 Drawing Sheets

LOW CURRENT    HIGH CURRENT

DATA HOLDING DEVICE AND DATA HOLDING METHOD

CROSS-REFERENCE TO RELATED APPLICATION

The entire disclosure of Japanese Patent Application No. 2002-349861 filed on Dec. 2, 2002 and No. 2003-027189 filed on Feb. 4, 2003 including their specifications, claims, drawings and summaries are incorporated herein by reference in its entirety.

BACKGROUND OF THE INVENTION

1. Field of the Invention

This invention relates to a data holding device and a data holding method and, more particularly, to a data holding device and a data holding method using a nonvolatile memory element.

2. Description of Prior Art

As a data holding circuit for use in a sequential circuit such as a latch circuit, a circuit in which two inverter circuits are connected in a loop is known. Such a data holding circuit, however, can usually hold data only in a volatile manner, and the data are lost when the power source is interrupted. Namely, even when the power source is turned on again, it is impossible to restore the data to a state it was in before the power source was interrupted. Thus, when sequence processing using a latch circuit having such a data holding circuit must be suspended for some reason and the data must be held, the power source must be kept on and accordingly electric power is consumed. When sequence processing is terminated by an accidental power failure or the like, the processing must be restarted from the beginning, resulting in a large loss in time.

To solve the problems, a latch circuit 401 comprising such a data holding circuit described as above and a plurality of ferroelectric capacitors as shown in FIG. 24 (Japanese Patent Laid-Open No. 2001-126469) and a circuit 403 using a ferroelectric capacitor as shown in FIG. 25 (Japanese Patent Laid-Open No. Hei-05-250881) has been proposed.

Using the latch circuit 401 is advantageous since data can be held even when the power source is interrupted.

The latch circuit 401, however, has the following problems. Since the latch circuit 401 comprises a data holding circuit and a plurality of ferroelectric capacitors, a multiplicity of peripheral circuits and control lines for controlling them are necessary in addition to the ferroelectric capacitors. Thus, the circuit area is considerably large as compared with a latch circuit without a ferroelectric capacitor. The latch circuit 401 cannot therefore meet the demand of the industry for improving the integration degree.

Also, the latch circuit 401 requires fine timing control since data are stored in the plurality of ferroelectric capacitors or restored therefrom. Thus, there are severe limitations in designing a circuit. For example, it is necessary to pay attention to the temperature characteristics of the elements for use in the circuit or to provide a temperature compensation circuit.

In the circuit 403 shown in FIG. 25, ferroelectric capacitors connected in series to gate capacitance of field-effect transistors are connected in a flip-flop state. The ferroelectric substance is polarized corresponding to stored data and the threshold voltage of the field-effect transistor is changed depending upon the polarization direction. Since the polarization of the ferroelectric substance is not lost even when the power source is interrupted, the change in the threshold value of the field-effect transistor is maintained.

Then, when the power source is turned on again, the data do not become indefinite but are specified because of the deviation in the threshold value of the field-effect transistors corresponding to the polarization. The data before power off can be thereby restored.

The circuit 403, however, has the following problems. Since the ferroelectric capacitor and the gate capacitance of the field-effect transistor are connected in series, the power source voltage is divided between the ferroelectric capacitor and the gate capacitance.

Thus, when the power source voltage is constant, the voltage applied to the ferroelectric capacitor is reduced, making it difficult to hold data with high reliability. Also, the voltage applied to the gate capacitance of the field-effect transistor is also reduced, the current flowing between the source and drain of the transistor is reduced, making the operation speed of the circuit slower.

The above problems could be solved by increasing the power source voltage. However, this reduces the reliability of the transistor and increases power consumption.

SUMMARY OF THE INVENTION

This invention has been made to solve the problems of the conventional circuits and it is, therefore, an object of this invention to provide a data holding device and a data holding method with which data can be held even when the power source is interrupted and the held data can be restored accurately, which do not largely increase the circuit area, and which do not require fine timing control.

Another object of this invention is to provide a high-speed and low-power consumption data holding device which can hold data even when the power source is interrupted, and which can hold data with high reliability.

A data holding device according to this invention comprises a data holding circuit in which data are held by connecting first and second inverter circuits in a loop at the time of latching data, and a nonvolatile memory element which records a nonvolatile state corresponding to data existing in the data holding circuit with one end of the nonvolatile memory element connected to an input node of the first inverter circuit at the time of writing data, and which discharges an electric charge which corresponds to the nonvolatile state recorded in the nonvolatile memory element and which can generate a voltage higher or lower than the threshold voltage of the first inverter circuit at the input node of the first inverter circuit to the input node of the first inverter circuit when the one end of the nonvolatile memory element is connected to the input node of the first inverter circuit and a reading signal is applied to the other end thereof at the time of restoring data, the data holding circuit having a loop switching gate which is interposed between a nonvolatile memory element connecting node defined as a connecting node between the input node of the first inverter circuit and the one end of the nonvolatile memory element, and an output node of the second inverter circuit, and which is on at the time of latching and writing data, and off in applying the reading signal and on after a lapse of a predetermined period of time at the time of restoring data.

A data holding method according to this invention comprises: a step of preparing a data holding device having a data holding circuit in which data are held by connecting first and second inverter circuits in a loop at the time of latching data, and a nonvolatile memory element having an end which is connected to an input node of the first inverter circuit at least at the time of writing and restoring data, the data holding circuit having a loop switching gate interposed between a nonvolatile memory element connecting node defined as a connecting node between the input node of the first inverter circuit and the one end of the nonvolatile memory element, and an output node of the second inverter circuit; a step of recording a nonvolatile state corresponding to data existing in the data holding circuit in the nonvolatile memory element with the one end of the nonvolatile memory element connected to the input node of the first inverter circuit at the time of writing data; and a step of restoring data corresponding to a nonvolatile state recorded in the nonvolatile memory element in the data holding circuit, including the steps of switching off the loop switching gate with the power source of the data holding device on, allowing the nonvolatile memory element to discharge an electric charge which corresponds to the nonvolatile state recorded therein and can generate a voltage higher or lower than the threshold voltage of the first inverter circuit at the input node of the first inverter circuit to the input node of the first inverter circuit by connecting the one end of the nonvolatile memory element to the input node of the first inverter circuit and applying a reading signal to the other end of the nonvolatile memory element, and connecting the first and second inverter circuits in a loop by switching on the loop switching gate after a lapse of a predetermined period of time at the time of restoring data.

A data holding device according to this invention having a data holding circuit in which data are held by connecting two inverter circuits in a loop, comprises: a variable resistance element interposed between a memory node of the data holding circuit and a reference potential; and a nonvolatile memory element for controlling the resistance value of the variable resistance element, wherein a state corresponding to data stored in the data holding circuit is recorded in the nonvolatile memory element, and data corresponding to a state recorded in the nonvolatile memory element are restored in the data holding circuit.

A data holding device according to this invention having a data holding circuit in which data are held by connecting two inverter circuits in a loop, comprises: a variable resistance element interposed between a memory node of the data holding circuit and a reference potential; and a nonvolatile memory element for controlling the resistance value of the variable resistance element, wherein a state corresponding to data at optional point in time stored in the data holding circuit is recorded in the nonvolatile memory element and data corresponding to a state recorded in the nonvolatile memory element is restored in the data holding circuit.

A data holding method according to this invention comprises: a step of preparing a data holding device having a data holding circuit in which data are held by connecting two inverter circuits in a loop, a variable resistance element interposed between a memory node of the data holding circuit and a reference potential, and a nonvolatile memory element for controlling the resistance value of the variable resistance element; a step of automatically writing data in the data holding circuit into the nonvolatile memory element; a step in which the nonvolatile memory element holds the final data in the data holding circuit while the power source of the data holding device is off; and a step of restoring data held in the nonvolatile memory element in the data holding circuit when the power source of the data holding device is restored.

A data holding method according to this invention comprises: a step of preparing a data holding device having a data holding circuit in which data are held by connecting two inverter circuits in a loop, a variable resistance element interposed between a memory node of the data holding circuit and a reference potential, and a nonvolatile memory element for controlling the resistance value of the variable resistance element; a step of writing data, at an optional point in time, in the data holding circuit into the nonvolatile memory element; a step in which the nonvolatile memory element holds data written therein while the power source of the data holding device is off; and a step of restoring data held in the nonvolatile memory element in the data holding circuit when the power source of the data holding device is restored.

Although the features of this invention can be generally described as above, the constitution and details, together with the objects and features, of this invention will be more apparent from the following disclosure in conjunction with appended drawings.

BRIEF DESCRIPTION OF THE DRAWINGS

FIG. 13C is a diagram illustrating an equivalent circuit of a nonvolatile memory element 205 at the time when a transfer gate 203 is on;

DESCRIPTION OF THE PREFERRED EMBODIMENT

Figure 1:
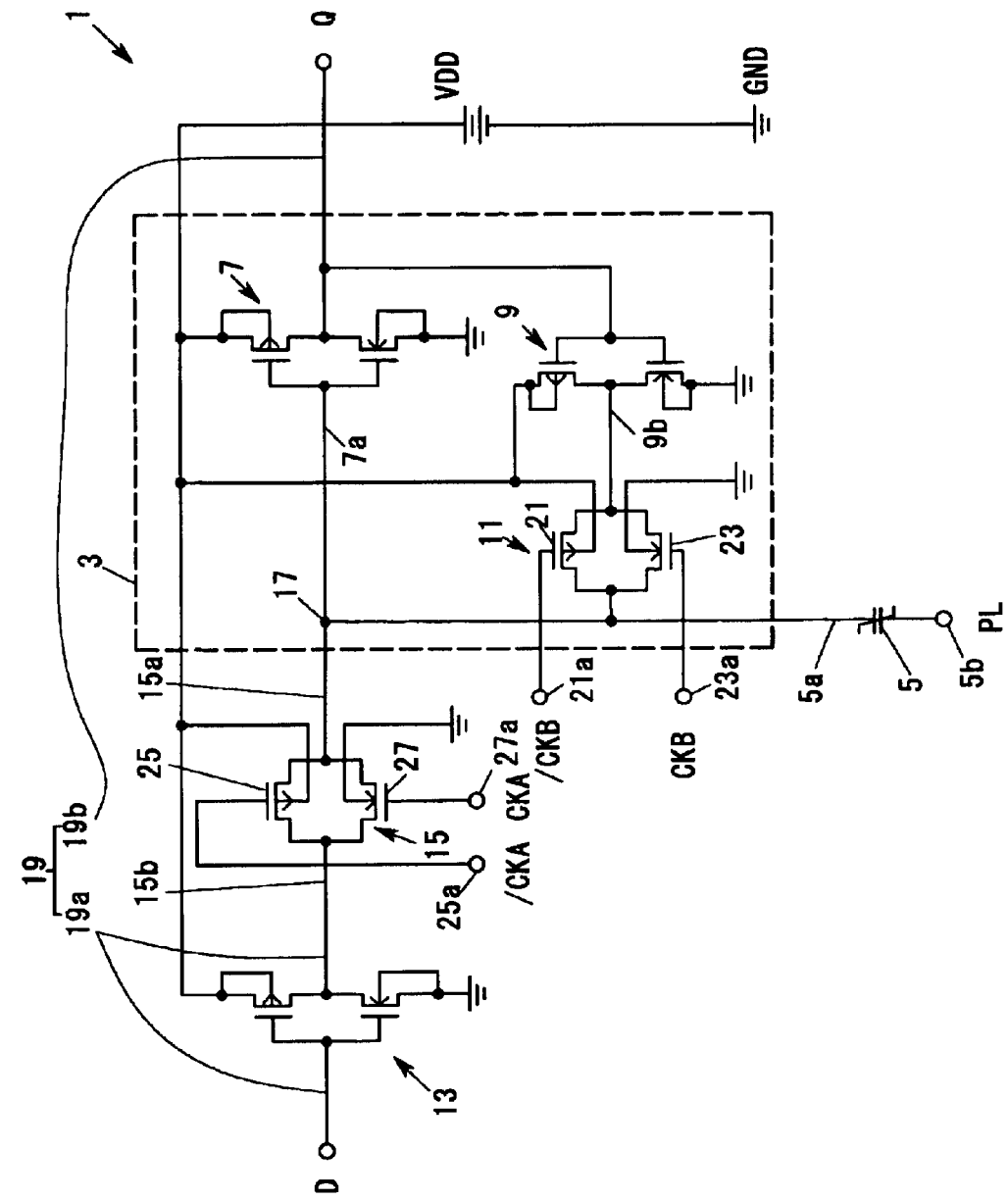
FIG. 1 is a circuit diagram illustrating the configuration of a data holding device 1 according to an embodiment of this invention.

FIG. 1 is a circuit diagram illustrating a data holding device 1 according to an embodiment of this invention. The data holding device 1 comprises a data holding circuit 3, a ferroelectric capacitor 5 as a nonvolatile memory element, an inverter circuit 13 and a transfer gate 15 as a data switching gate.

The data holding circuit 3 holds data when inverter circuits 7 and 9 as first and second inverter circuits are connected in series in a loop at the time of latching data. The inverter circuit 7 is located in a main signal path and the inverter circuit 9 is located in a feedback signal path.

Namely, in this embodiment, the first and second inverter circuits are realized as an inverter circuit disposed in a main signal path and an inverter circuit disposed in a feedback signal path, respectively.

The main signal path is a principal signal path for transmitting a signal from an input-side data transmitting path 19a to an output-side data transmitting path 19b of signal paths constituting the data holding circuit 3. The feedback signal path is a signal path for feeding back a signal from the output-side data transmitting path 19b to the input-side data transmitting path 19a of signal paths constituting the data holding circuit 3.

The ferroelectric capacitor 5 records a polarization state corresponding to data held in the data holding circuit 3 when one end 5a of the ferroelectric capacitor is connected to an input node 7a of the inverter circuit 7 and a writing signal is applied to the other end 5b thereof at the time of writing data. The polarization state of the ferroelectric capacitor corresponds to the nonvolatile state of the nonvolatile memory element.

The ferroelectric capacitor 5 discharges an electric charge which corresponds to a recorded polarization state and which can generate a voltage higher or lower than the threshold voltage of the inverter circuit 7 at the input node 7a of the inverter circuit 7 to the input node 7a of the inverter circuit 7 when the one end 5a of the ferroelectric capacitor is connected to the input node 7a of the inverter circuit 7 and a reading signal is applied to the other end 5b thereof at the time of restoring data.

The signals applied to the other end 5b of the ferroelectric capacitor 5 will be referred to as "plate line signals PL". Thus, the writing signal and the reading signal are plate line signals PL. The other end 5b can be regarded as a writing signal receiving end and/or a reading signal receiving end.

In this embodiment, the one end 5a of the ferroelectric capacitor 5 and the input node 7a of the inverter circuit 7 are fixedly connected as shown in FIG. 1.

The data holding circuit 3 has a transfer gate 11 as a loop switching gate. The transfer gate 11 is interposed between a ferroelectric connecting node 17 defined as a connecting node between the input node 7a of the inverter circuit 7 and the one end 5a of the ferroelectric capacitor 5, and an output node 9b of the inverter circuit 9. The ferroelectric connecting node 17 corresponds to a nonvolatile memory element connecting node.

The transfer gate 11 is on at the time of latching and writing data, and off in applying the reading signal and on after a lapse of a predetermined period of time at the time of restoring data.

The transfer gate 15 has one end 15a connected to the ferroelectric connecting node 17 and the other end 15b connected to the input-side data transmitting path 19a of data transmitting paths 19 connecting the data holding circuit 3 and the outside. The transfer gate 15 is on at the time of transmitting date, and off while the transfer gate 11 is off and on after a lapse of a predetermined period of time at the time of restoring data.

The inverter circuit 13 is interposed in the input-side data transmitting path 19a. Input data D are given to the other end 15b of the transfer gate 15 via the inverter circuit 13.

The transfer gate 11 is constituted of a transistor 23, which is an nMOSFET (nMOS field-effect transistor), and a transistor 21, which is a pMOSFET (pMOS field-effect transistor). The transistors 23 and 21 have gate terminals 23a and 21a, respectively, to which a clock pulse CKB and a clock pulse /CKB, which will be described later, are applied, respectively. The clock pulse /CKB is an inverted signal of the clock pulse CKB.

The transfer gate 15 is constituted of a transistor 27, which is an nMOSFET, and a transistor 25, which is a pMOSFET, as in the case with the transfer gate 11. The transistors 27 and 25 have gate terminals 27a and 25a, respectively, to which a clock pulse CKA and a clock pulse /CKA, which will be described later, are applied, respectively. The clock pulse /CKA is an inverted signal of the clock pulse CKA.

Figure 2:
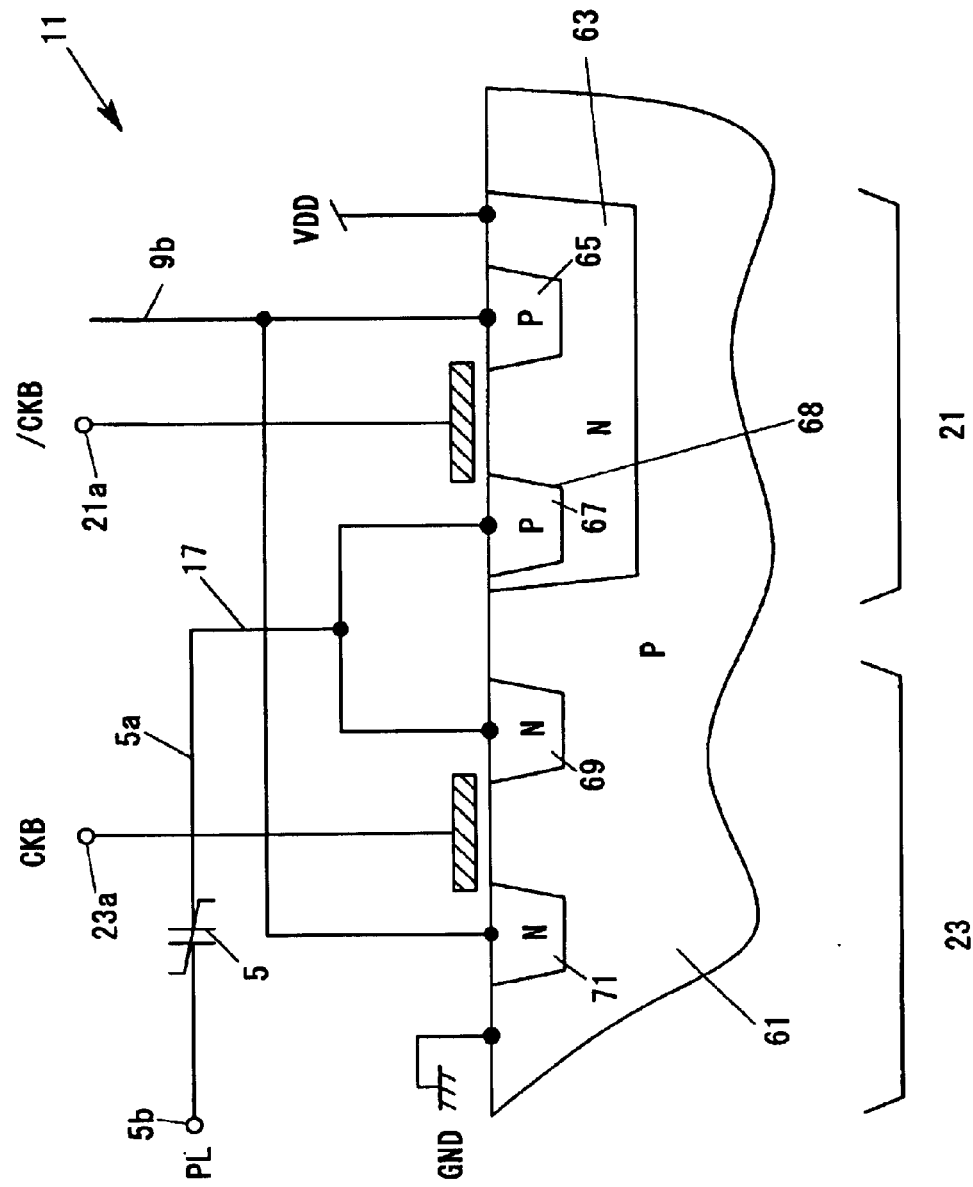
FIG. 2 is a schematic diagram illustrating a specific configuration of a transfer gate 11.

FIG. 2 is a schematic diagram illustrating a specific configuration of the transfer gate 11. The transistor 23 comprises a P-type semiconductor substrate 61, and a source region 69 and a drain region 71 formed in the semiconductor substrate 61. The source region 69 and the drain region 71 are made of an N-type semiconductor. A ground potential GND is applied to the semiconductor substrate 61.

The transistor 21 has an N-type well region 63 formed in the semiconductor substrate 61, and a source region 65 and a drain region 67 formed in the well region 63. The source region 65 and the drain region 67 are made of a P-type semiconductor. A power source potential VDD is applied to the well region 63.

The transistor 21 corresponds to a limiter field-effect transistor as a limiter element. Namely, the drain region 67 as a source/drain region (corresponding to a connecting-node-side semiconductor region) is connected to the ferroelectric connecting node 17. As described above, the power source potential VDD, having a polarity which is the same as the polarity (positive) of the electric charge discharged to the ferroelectric connecting node 17 by application of a reading signal, is applied to the well region 63 as a base semiconductor region. The transistor 21 has a junction 68 at which the drain region 67 is joined to the well region 63 in the forward direction for the discharged electric charge (positive electric charge).

In this embodiment, the transfer gate 15 shown in FIG. 1 has the same structure as the transfer gate 11, and the transistor 25 constituting the transfer gate 15 corresponds to a limiter field-effect transistor.

Figure 3:
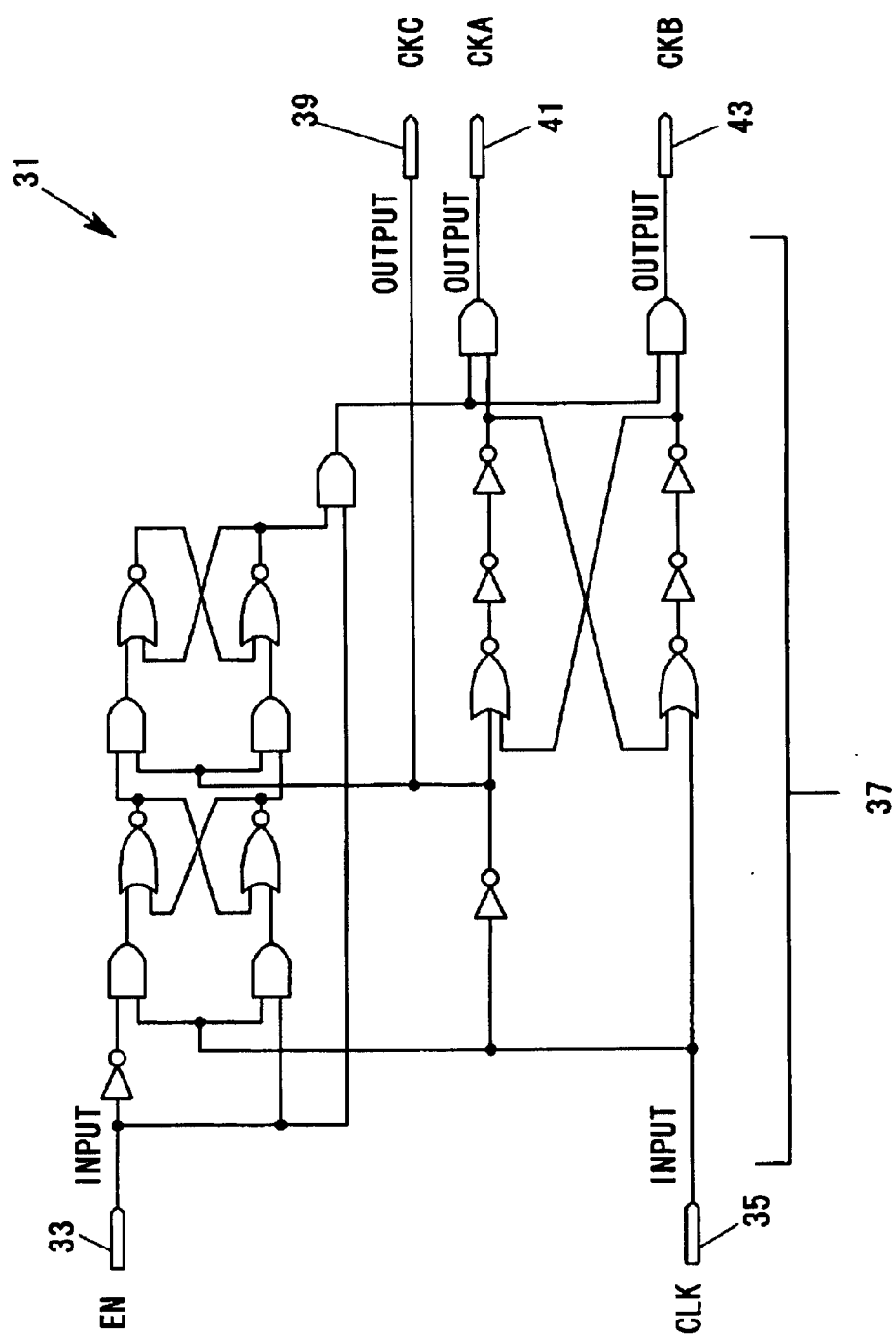
FIG. 3 is a circuit diagram illustrating an example of the configuration of a clock generating circuit for supplying a plurality of clock pulses necessary for the data holding device 1.

FIG. 3 is a circuit diagram illustrating an example of a clock generating circuit for supplying a plurality of clock pulses necessary for the data holding device 1. A clock generating circuit 31 has an enable signal input terminal 33, a basic clock input terminal 35, a clock generating part 37, a third clock output terminal 39, a first clock output terminal 41, and a second clock output terminal 43.

The enable signal input terminal 33 is a terminal for receiving a hereinafter described enable signal EN. The basic clock input terminal 35 is a terminal for receiving a clock pulse CLK as a basic signal for controlling the operation of the data holding device 1. The third clock output terminal 39 is a terminal for outputting a clock pulse CKC (third clock pulse) which is obtained by giving a prescribed delay to an inverted signal of the clock pulse CLK.

The first clock output terminal 41 is a terminal for outputting the clock pulse CKA (first clock pulse). The transfer gate 15 is on and off by the clock pulse CKA outputted from the first clock output terminal 41 and the clock pulse /CKA, which is an inverted signal of the clock pulse CKA, as described before.

The second clock output terminal 43 is a terminal for outputting the clock pulse CKB (second clock pulse). The transfer gate 11 is on and off by the clock pulse CKB outputted from the second clock output terminal 43 and the clock pulse /CKB, which is an inverted signal of the clock pulse CKB, as described before.

The clock generating part 37 is constituted of a multiplicity of logic gates, and generates the clock pulse CKC, the clock pulse CKA, and the clock pulse CKB based on the enable signal EN and the clock pulse CLK.

Figure 6:
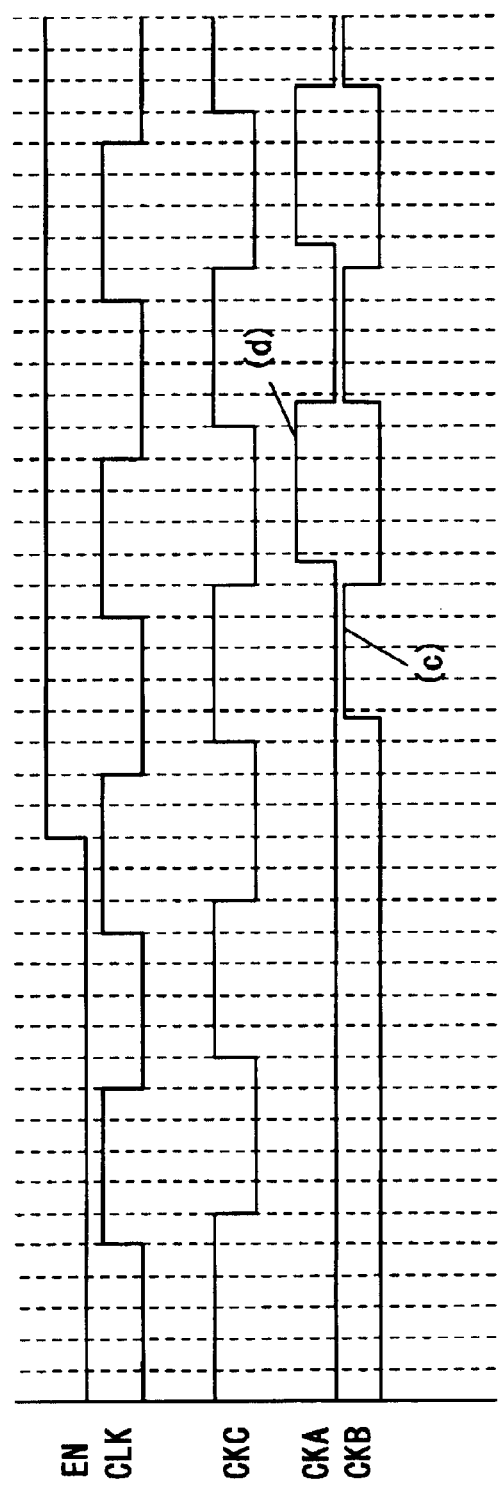
FIG. 6 is a timing chart illustrating the relation among an enable signal EN, a clock pulse CLK, a clock pulse CKC, a clock pulse CKA and a clock pulse CKB.

FIG. 6 shows the relation among the enable signal EN, the clock pulse CLK, the clock pulse CKC, the clock pulse CKA and the clock pulse CKB. When the fact that there is a section in which the clock pulse CKA and the clock pulse CKB are both at logic "L" is ignored, they are wholly complementary signals.

Thus, in the data holding device 1 (see FIG. 1) constituted as described above, transmission of data and latching of the data are alternately repeated. Namely, the transfer gates 11 and 15 are controlled to be off and on, respectively, at the time of transmitting data. Namely, at the time of transmitting data, input data D given to the data holding device 1 are outputted as they are as output data Q through the inverter circuit 13, the transfer gate 15 and the inverter circuit 7.

The transfer gates 11 and 15 are controlled to be on and off, respectively, at the time of latching data. Namely, at the time of latching data, data inputted immediately before the latching are held in the data holding circuit 3 and data having held therein are outputted as output data Q.

Figure 4:
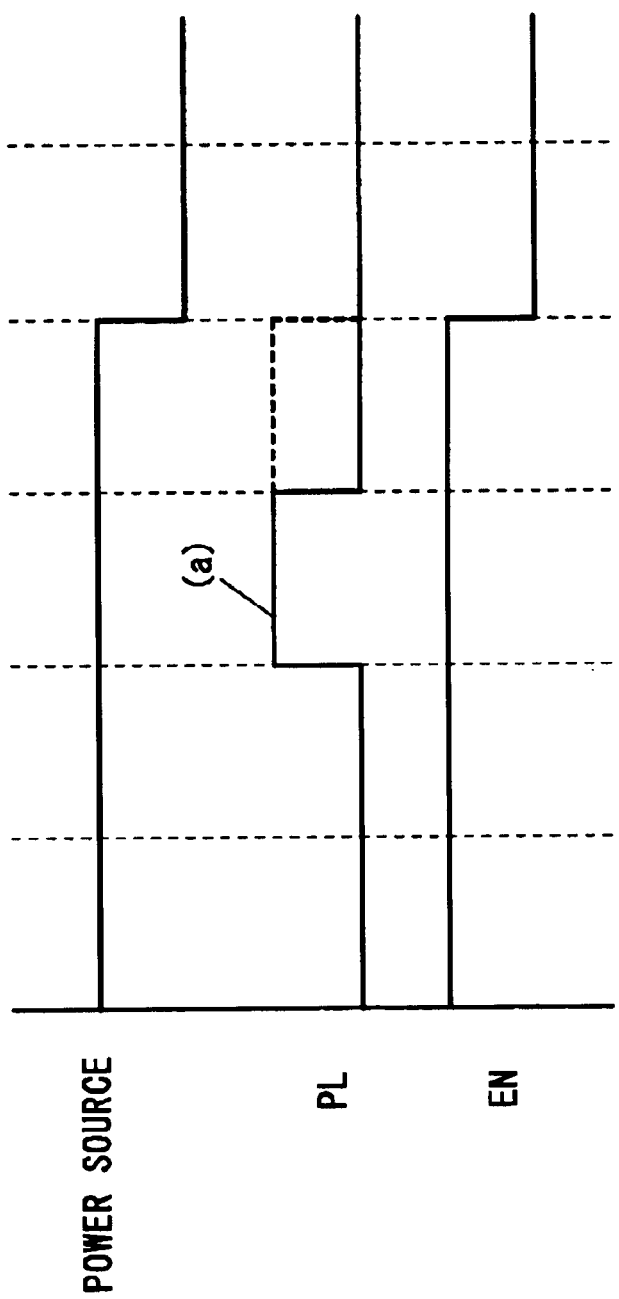
FIG. 4 is an example of a timing chart for explaining a data writing operation in the data holding device 1.

FIG. 4 is an example of a timing chart for explaining an operation to write data, namely a data writing operation, in the data holding device 1. Descriptions will be made of the data writing operation with reference to FIG. 4.

In the data writing operation, a writing signal (a) as a plate line signal PL is applied to the other end 5b of the ferroelectric capacitor 5 with both the power source of the data holding device 1 and the enable signal EN on.

The writing signal (a) is a rectangular signal generated by transitioning a plate line signal PL from logic "L" to logic "H" and then to logic "L". By applying the writing signal (a) to the other end 5b of the ferroelectric capacitor 5, a polarization state corresponding to the data currently held in the data holding circuit 3 is recorded in the ferroelectric capacitor 5.

Then, the power source is turned off. When the power source is turned off, the enable signal EN also becomes off (logic "L").

In the example shown in FIG. 4, the plate line signal PL having transitioned to logic "H" is returned to logic "L" and then the power source is turned off as shown by solid lines. However, the power source may be turned off without returning the plate line signal PL to logic "L" as shown by broken lines. Only the enable signal EN can be turned off without turning off the power source.

Figure 5:
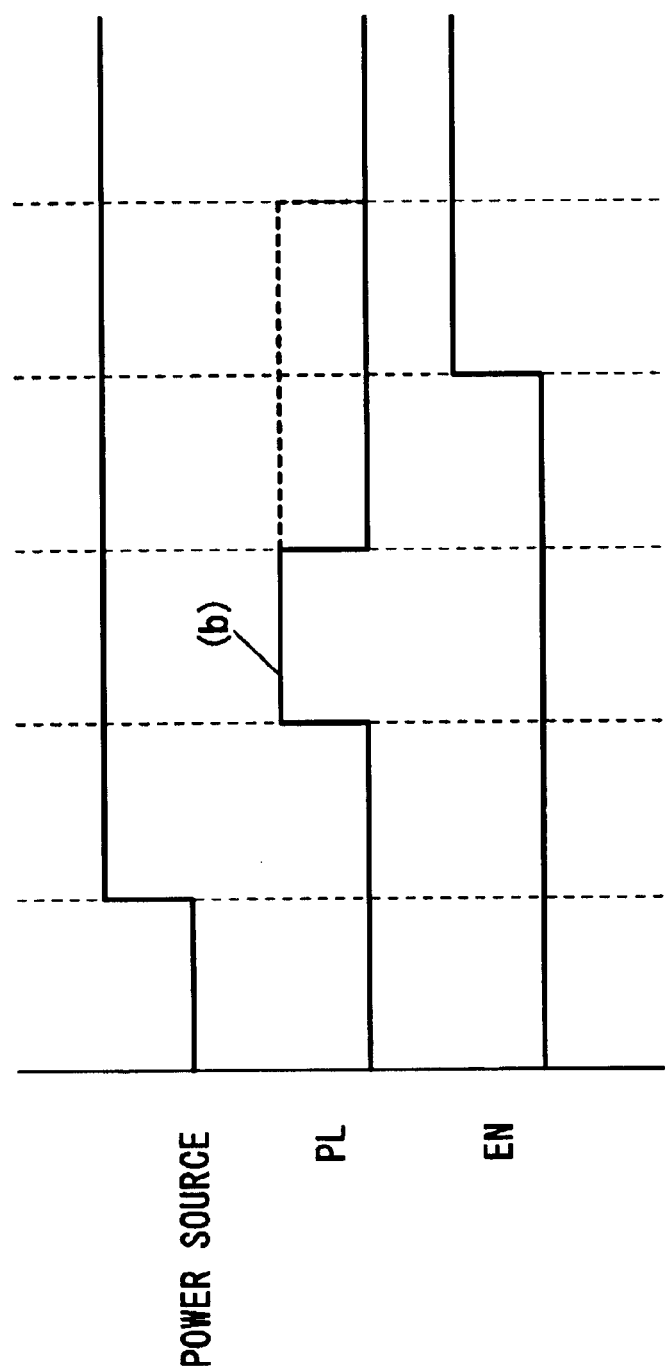
FIG. 5 is an example of a timing chart for explaining a data restoring operation in the data holding device 1.

FIG. 5 is an example of a timing chart for explaining an operation to restore data, namely a data restoring operation, in the data holding device 1. Descriptions will be made of the date restoring operation with reference to FIG. 5 and FIG. 6.

In the data restoring operation, the power source of the data holding device 1 is turned on and a reading signal (b) as a plate line signal PL is applied to the other end 5b of the ferroelectric capacitor 5 as shown in FIG. 5.

The reading signal (b) is a rectangular signal generated by transitioning a plate line signal PL from logic "L" to logic "H" and then to logic "L". By applying the writing signal (b) to the other end 5b of the ferroelectric capacitor 5, an electric charge corresponding to a polarization state recorded in the ferroelectric capacitor 5 is discharged to the ferroelectric connecting node 17.

In this state, the enable signal EN is still at "L". Thus, the clock pulses CKA and CKB are both at logic "L" as shown in FIG. 6. Namely, the transfer gates 11 and 15 are both off. Thus, the electric charge discharged to the ferroelectric connecting node 17 does not leak to the side of the inverter circuit 9 through the transfer gate 11 or to the side of the inverter circuit 13 through the transfer gate 15 (see FIG. 1).

Also in this state, since the power source of the data holding device 1 is on as described above, the power source potential VDD is applied to the well region 63 of the transistor 21 constituting the transfer gate 11 as shown in FIG. 2. Thus, even when the potential at the ferroelectric connecting node 17 is increased by the electric charge discharged to the ferroelectric connecting node 17, no electric charge leaks to the well region 63 unless the potential exceeds the power source potential VDD.

Similarly, no electric charge leaks to the well region (not shown) of the transistor 25 constituting of the transfer gate 15 unless the potential at the ferroelectric connecting node 17 exceeds the power source potential VDD.

The discharged electric charge stays in the ferroelectric connecting node 17 unless the potential at the ferroelectric connecting node 17 exceeds the power source potential VDD. Thus, the potential at the ferroelectric connecting node 17 accurately reflects the discharged electric charge, which is advantageous.

When the discharged electric charge is excessively high or an unnecessary electric charge remains in the ferroelectric connecting node 17 because of some failure, the potential at the ferroelectric connecting node 17 may exceed the power source potential VDD.

In such a case, the excess electric charge flows into the power source (potential VDD) through the drain region 67, the junction 68 and the well region 63 of the transistor 21 constituting the transfer gate 11 as shown in FIG. 2. Also, the excess electric charge flows into the power source (potential VDD) connected to the well region (not shown) of the transistor 25 constituting the transfer gate 15.

Thus, in this embodiment, even when the discharged electric charge is excessively high or unnecessary electric charge remains in the ferroelectric connecting node 17, the potential at the ferroelectric connecting node 17 does not exceed the power source potential VDD by the discharge of the electric charge. Namely, the device is prevented from being damaged by such an accident.

Then, the enable signal is turned on as shown in FIG. 5. Then, as shown in FIG. 6, the clock pulse CKB becomes logic "H" (see FIG. 6(c)). At this time, the clock pulse CKA stays at logic "L". Namely, the transfer gate 15 shown in FIG. 1 stays off and only the transfer gate 11 is switched on.

Thus, the data holding circuit 3 is kept disconnected from the input-side data transmitting path 19a and its loop is kept closed. Namely, the inverter circuits 7 and 9 are connected in a loop without the influence from the outside. Thus, the potential at the ferroelectric node 17 reaches a logic level (logic "H" or logic "L") which accurately reflects the discharged electric charge without being influenced by input data.

Figure 7:
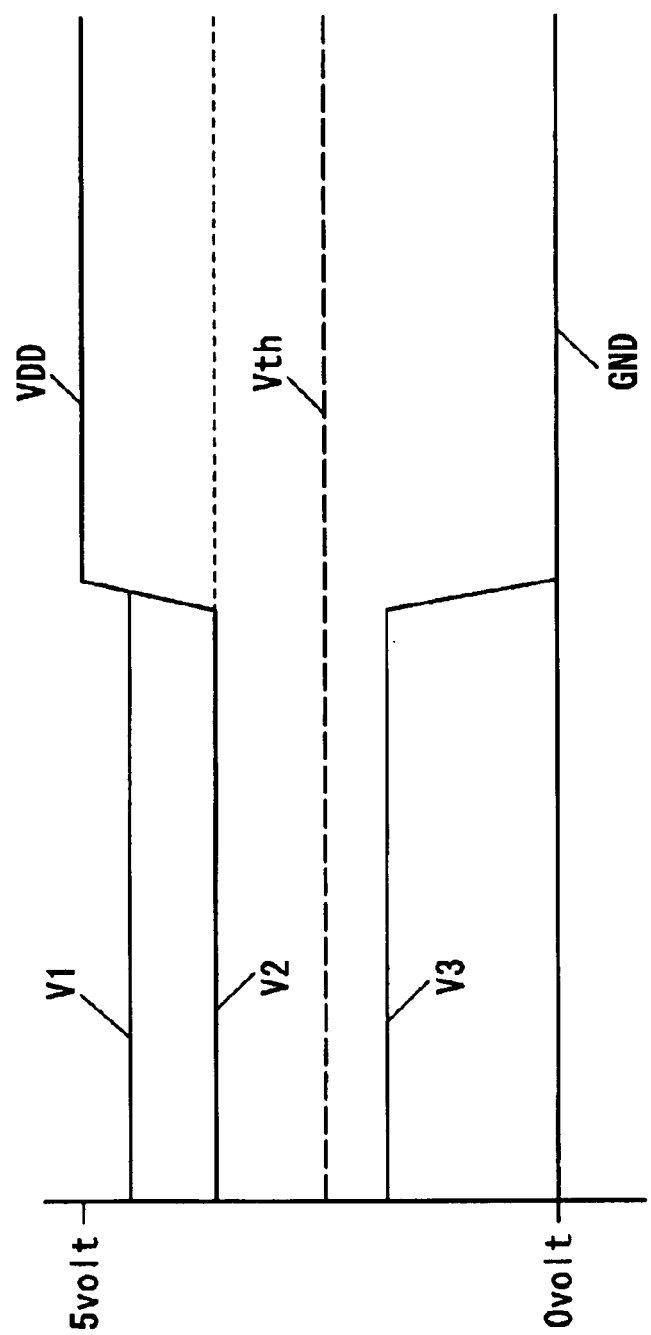
FIG. 7 is a graph showing a result of simulation of change in potential in a ferroelectric connecting node 17 during a data restoring operation.

FIG. 7 is a graph showing a result of simulation of change in potential at the ferroelectric connecting node 17 during a data restoring operation.

As shown in FIG. 7, when the potential rise due to the discharge of electric charge is significant and the potential at the ferroelectric connecting node 17 exceeds the threshold voltage Vth of the inverter circuit 7 (see FIG. 1) (becomes a voltage V1 or V2, for example), the potential at the ferroelectric connecting node 17 becomes the power source potential VDD, namely logic "H", when the loop of the data holding circuit 3 is closed.

When the potential rise due to the discharge of electric charge is not very significant and the potential at the ferroelectric connecting node 17 does not exceed the threshold voltage Vth of the inverter circuit 7 (becomes a voltage V3, for example), the potential at the ferroelectric connecting node 17 becomes the ground potential GND, namely logic "L", when the loop of the data holding circuit 3 is closed.

Then, the clock pulse CKB becomes logic "L" and the clock pulse CKA becomes logic "H" (See FIG. 6(d)) as shown in FIG. 6. Namely, the transfer gate 15 and the transfer gate 11 shown in FIG. 1 are switched on and off, respectively. The next input dada D are thereby input into the data holding device.

In the example shown in FIG. 5, the plate line signal PL having transitioned to logic "H" is returned to logic "L" and then the enable signal EN is turned off as shown by solid lines. However, the enable signal EN may be turned on before the plate line signal is returned to logic "L" as shown by broken lines.

Figure 8:
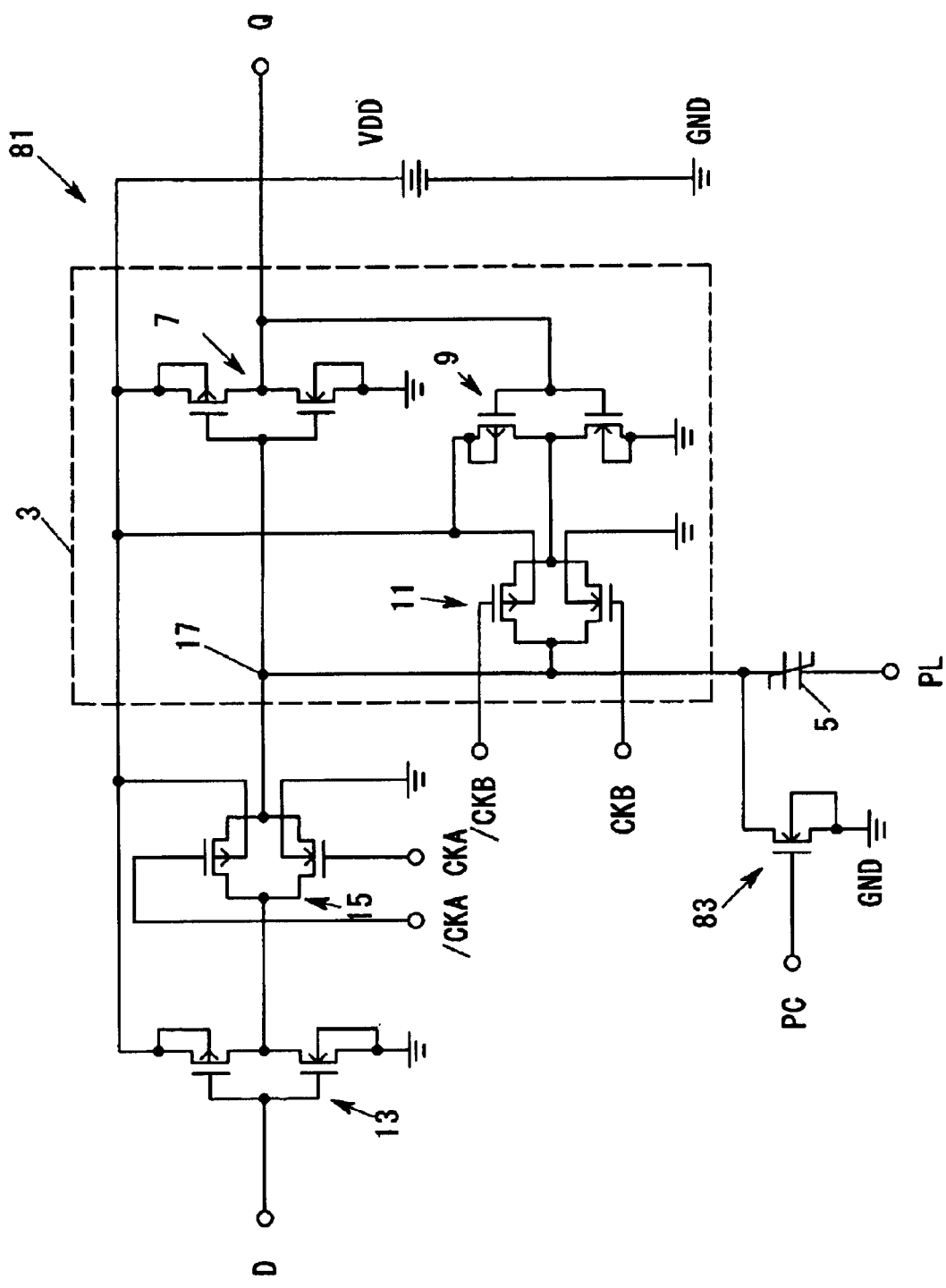
FIG. 8 is a circuit diagram illustrating a data holding device 81 according to another embodiment of this invention.

FIG. 8 is a circuit diagram illustrating a data holding device 81 according to another embodiment of this invention. The data holding device 81 is constituted by adding a transistor 83 as a precharge circuit to the data holding device 1 shown in FIG. 1, and has the same constitution as the data holding device 1 except that.

The transistor 83 has a drain region which is connected to the ferroelectric connecting node 17, a source region and a base semiconductor region which are connected to the ground potential GND, and a gate to which a precharge signal PC is applied.

Figure 9:
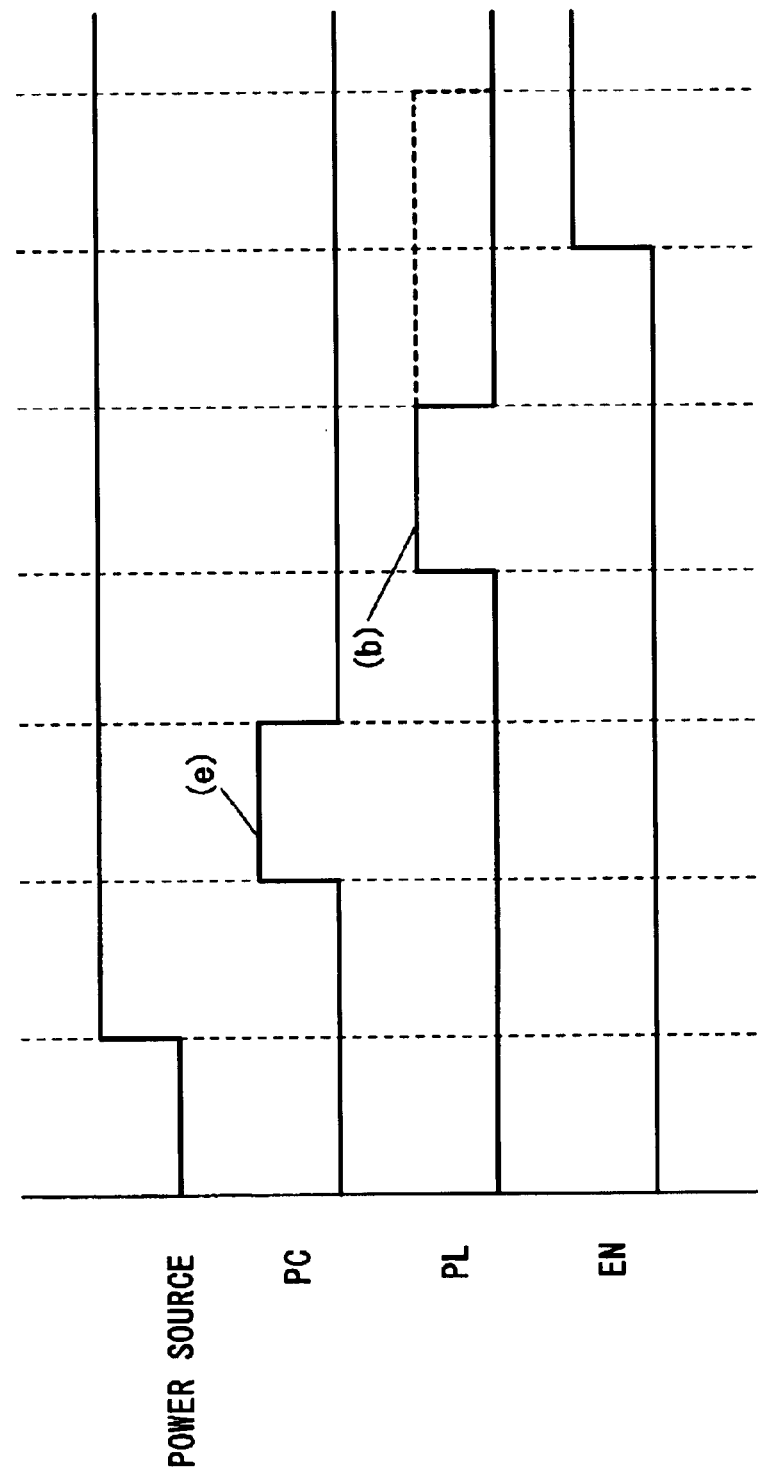
FIG. 9 is an example of a timing chart for explaining a data restoring operation in the data holding device 81.

FIG. 9 is an example of a timing chart for explaining a data restoring operation in the data holding device 81. The timing chart is different from that shown in FIG. 5 in which a precharge signal PC (a rectangular signal, see FIG. 9(e)) is applied before the reading signal (b) is applied as a plate line signal PL after the power source has been turned on.

In the data holding device 81 constituted as described above, an electric charge remaining in the ferroelectric connecting node 17 can be discharged before applying the reading signal (b). Data can be therefore restored more accurately.

Figure 10:
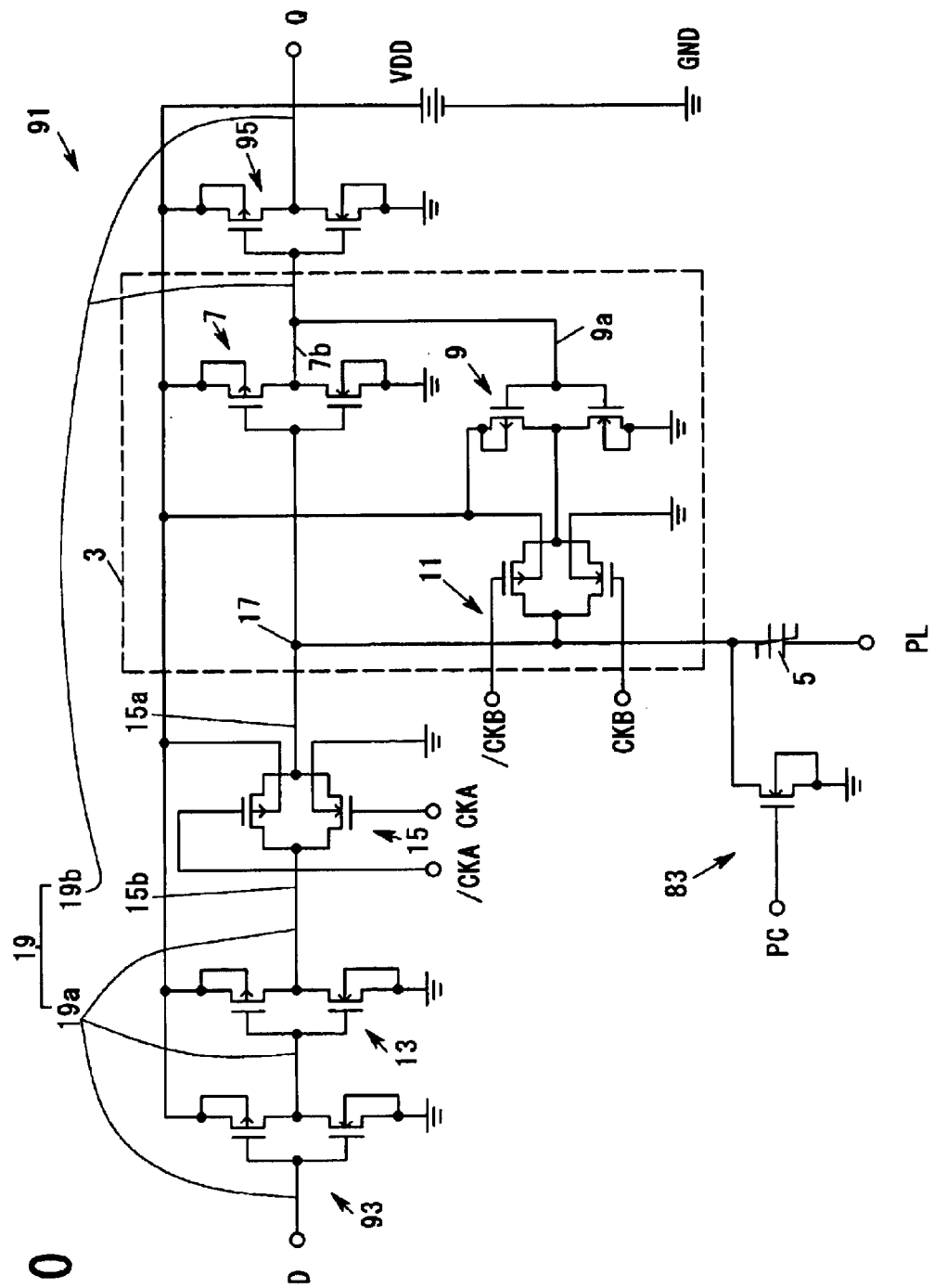
FIG. 10 is a circuit diagram illustrating a data holding device 91 according to another embodiment of this invention.

FIG. 10 is a circuit diagram illustrating a data holding device 91 according to another embodiment of this invention. The data holding device 91 is constituted by adding inverter circuits 93 and 95 as paired correcting inverter circuits to the data holding device 81 shown in FIG. 8, and has the same constitution as the data holding device 81 except that.

The inverter circuit 93 is interposed in the input-side data transmitting path 19a. In this example, the inverter circuit 93 is located upstream of the data holding circuit 13 in the input-side data transmitting path 19a.

The inverter circuit 95 is interposed in the output-side data transmitting path 19b. In this example, the inverter circuit 95 is located immediately downstream of the data holding circuit 3 in the output-side data transmitting path 19b.

In the data holding device 91 constituted as described above, when the electric charge in the ferroelectric connecting node 17 is discharged by the transistor 83 and the logic value of the ferroelectric connecting node 17 becomes logic "L", the logic value of the output of the data holding device 91 can be logic "L".

Thus, since the output from the data holding device 91 corresponding to a precharge, namely reset, can be logic "L", a logic circuit (not shown) using the output from the data holding device 91 can be easily constituted.

Although pMOSFETs are used as the limiter field-effect transistors in the above embodiments, this invention is not limited to that. For example, when the electric charge discharged to the nonvolatile memory element connecting node is a negative electric charge, the nMOSFETs correspond to the limiter field-effect transistors in this invention.

Although both of the loop switching gate and the data switching gate are provided with a limiter field-effect transistor in the above embodiments, this invention is not limited to that. For example, a limiter field-effect transistor may be provided in either the loop switching gate or the data switching gate. Alternatively, neither of the loop switching gate nor the data switching gate may be provided with a limiter field-effect transistor.

Although limiter field-effect transistors are used as the limiter elements in the above embodiments, this invention is not limited to that. For example, diodes may be used as the limiter elements.

Figure 11:
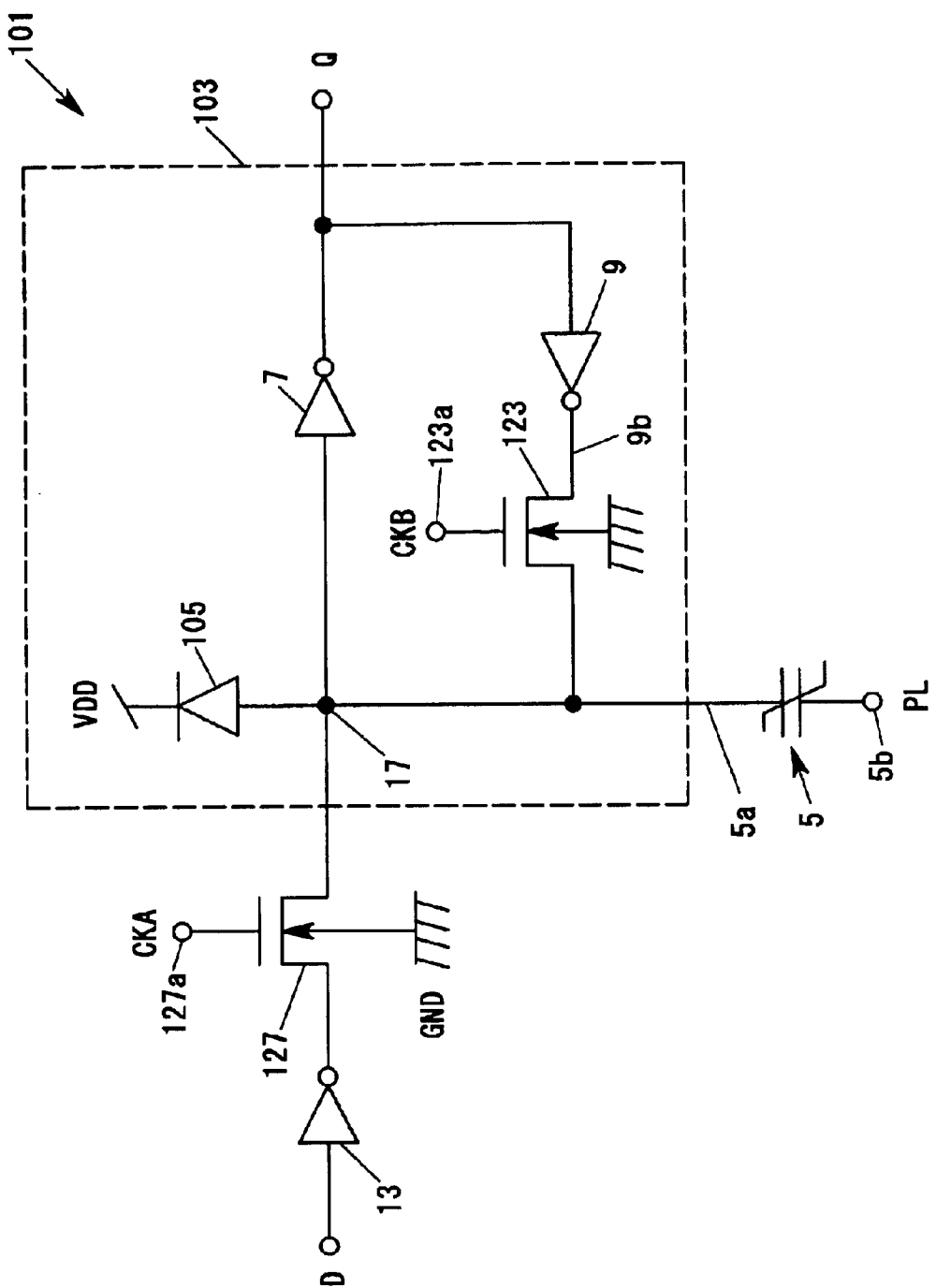
FIG. 11 is a circuit diagram illustrating a data holding device 101 according to another embodiment of this invention.

FIG. 11 is a circuit diagram illustrating a data holding device 101 according to another embodiment of this invention. The data holding device 101 is different from the data holding device 1 shown in FIG. 1 in having a diode 105 as a limiter element (limiter diode). Also, transistors 123 and 127 are used in place of the transfer gates 11 and 15, respectively. The data holding device 101 has the same constitution as the data holding device 1 except those. Designated as 103 is a data holding circuit constituting the data holding device and corresponds to the data holding circuit 3 in FIG. 1.

The diode 105 is a pn junction diode and has an anode connected to the ferroelectric connecting node 17 and a cathode to which a power source potential VDD is applied. The transistors 123 and 127 are both nMOSFETs and have gate terminal 123a and 127a, respectively, to which the clock pulse CKB and the clock pulse CKA are applied, respectively.

Figure 12:
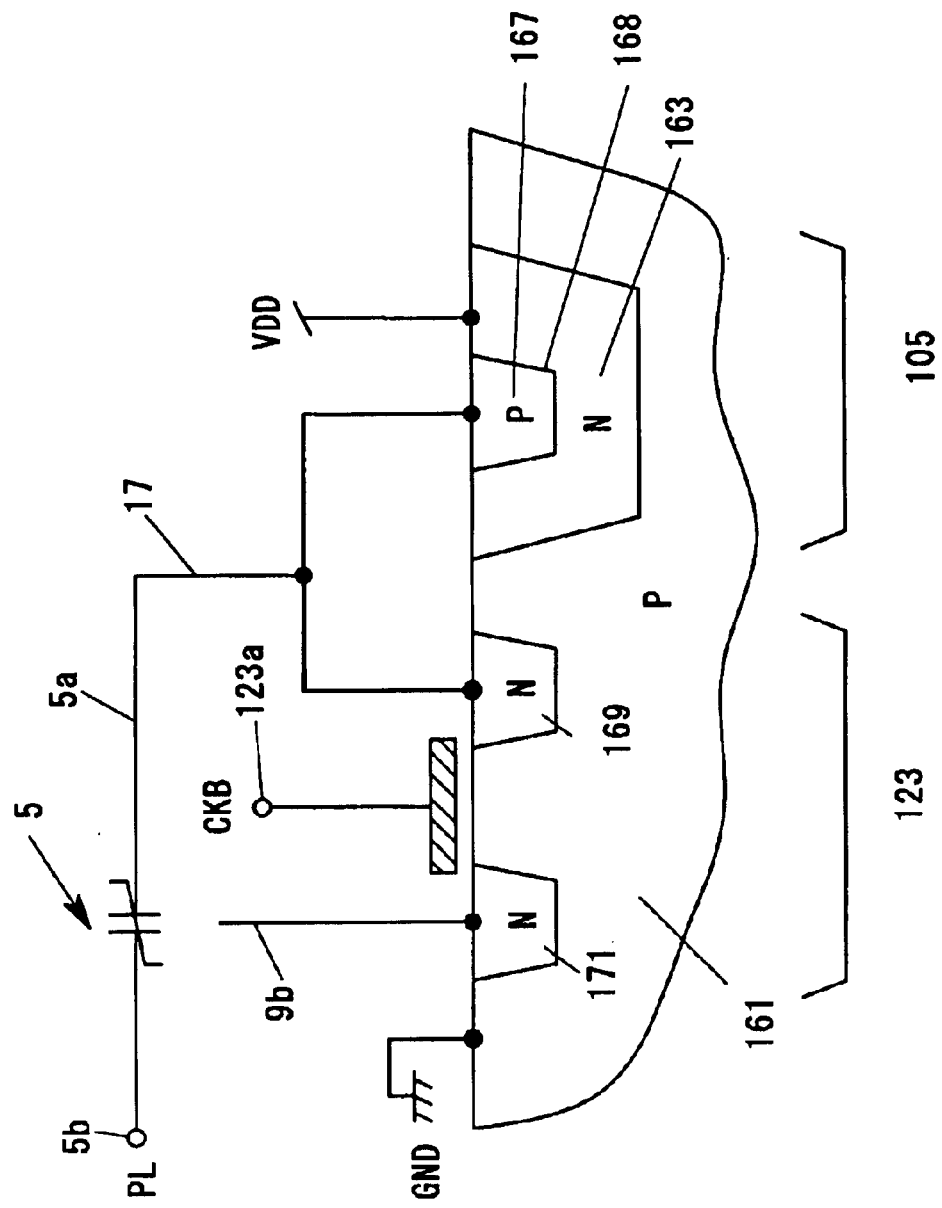
FIG. 12 is a schematic diagram illustrating a specific configuration of a diode 105 and a transistor 123.

FIG. 12 is a schematic diagram illustrating a specific configuration of the diode 105 and the transistor 123. The transistor 123 comprises a P-type semiconductor substrate 161, and a source region 169 and a drain region 171 formed in the semiconductor substrate 161. The source region 169 and the drain region 171 are made of an N-type semiconductor. A ground potential GND is applied to the semiconductor substrate 161.

The diode 105 has a cathode-side region 163 formed in the semiconductor substrate 161 and an anode-side region 167 formed in the cathode-side region 163. The cathode-side region 163 and the anode-side region 167 are made of an N-type semiconductor and a P-type semiconductor, respectively. A power source potential VDD is applied to the cathode-side region 163.

As described before, the diode 105 corresponds to the limiter diode as a limiter element. Namely, the anode-side region 167 (which corresponds to a connecting-node-side semiconductor region) is connected to the ferroelectric connecting node 17. As described before, a power source potential VDD having a polarity which is the same as the polarity (positive) of the electric charge discharged to the ferroelectric connecting node 17 by application of a reading signal is applied to the cathode-side region 163 as a base semiconductor region. The diode 105 has a junction 168 (pn junction) at which the anode-side region 167 is joined to the cathode-side region 163 in the forward direction for the discharged electric charge (positive electric charge).

Although the transistors 123 and 127 are used as the loop switching gate and the data switching gate, respectively, in the example shown in FIG. 11, the loop switching gate and the data switching gate are not limited to that. For example, the transfer gates 11 or 15 as shown in FIG. 1 may be used as the loop switching gate or the data switching gate.

Although the data holding device has a data switching gate in the above embodiments, this invention is applicable to a data holding device without a data switching gate.

Although the first and second inverter circuits are inverter circuits located in a main signal path and a feedback signal path, respectively, constituting the data holding circuit in the above embodiments, this invention is not limited to that.

This invention is applicable to a data holding device in which the first and second inverter circuits are located in a feedback signal path and a main signal path, respectively, constituting a data holding circuit. In this case, the one end of the nonvolatile memory element is connected to the input node of the inverter circuit located in the feedback signal path.

Although a nonvolatile state corresponding to data existing in the data holding circuit at the time of latching data, namely latched data, is recorded in the nonvolatile memory element in the above embodiments, this invention is not limited to that.

For example, a nonvolatile state corresponding to data passing through the data holding circuit (transmitted data at the time of transmitting data) may be recorded in the nonvolatile memory element. In the data holding device constituted as described above, data can be recorded in a nonvolatile manner prior to a latch operation.

Alternatively, a nonvolatile state corresponding to data existing in the data holding circuit when (or immediately before) an error occurs may be recorded in the nonvolatile memory element whether or not at the time of latching data. In the data holding device constituted as described above, whenever an error occurs, correct data at the time when (or immediately before) the error occurs can be recorded in a nonvolatile manner. Thus, processing can be restarted using correct data when the power source is turned on again.

Although the nonvolatile memory element is constituted of only a ferroelectric capacitor in the above embodiments, this invention is not limited to that.

The nonvolatile memory element may be a ferroelectric transistor substantially including a ferroelectric capacitor, such as an MFMIS type FET (metal ferroelectric metal insulator semiconductor-field effect transistor) or a combination of a ferroelectric capacitor or a ferroelectric transistor and another element (electric or electronic element such as a transistor, resistance or paraelectric capacitor).

Figure 13C:
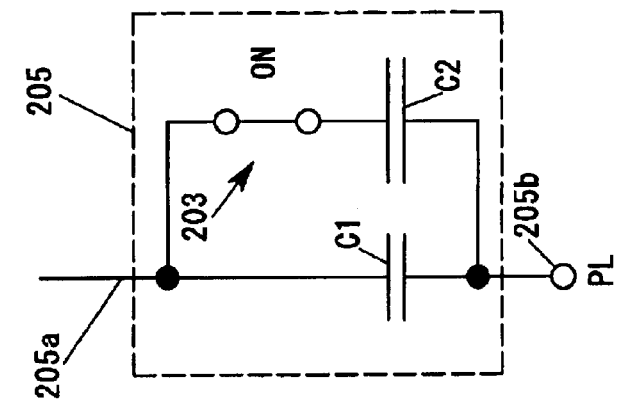

This invention is applicable to a data holding device having a nonvolatile memory element without a ferroelectric capacitor. FIG. 13A is a diagram illustrating an example of a nonvolatile memory element without a ferroelectric capacitor. For example, a nonvolatile memory element 205 shown in FIG. 13A is used in place of the ferroelectric capacitor 5 constituting the data holding device 1 shown in FIG. 1.

The nonvolatile memory element 205 has a switching data recording part 201 as a nonvolatile recording part and a capacitor part 202 constituted of one or more paraelectric capacitors. In this example, the capacitor part 202 has two paraelectric capacitors C1 (first paraelectric capacitor, having a capacitance of C1) and C2 (second paraelectric capacitor, having a capacitance of C2), which are connectable in parallel, and a transfer gate 203 as a capacitance varying switch.

The nonvolatile memory element 205 has one end 205a connected to a nonvolatile memory element connecting node (which corresponds to the ferroelectric connecting node 17 shown in FIG. 1) and the other end 205b to which a reading signal (a signal similar to the reading signal (b) shown in FIG. 5) as a plate line signal PL is applied at the time of restoring data.

The switching data recording part 201 records data corresponding to data which appear at the nonvolatile memory element connecting node in a nonvolatile manner as switching data automatically or based on a prescribed writing signal (not shown).

The transfer gate 203 is switched on or off according to the value of switching data recorded in the switching data recording part 201.

One end of the capacitor C1 is directly connected to the nonvolatile memory element connecting node. One end of the capacitor C2 is connected to the one end of the capacitor C1 via the transfer gate 203. The other ends of the capacitors C1 and C2 are connected to each other and constitute the other end 205b of the nonvolatile memory element 205.

Namely, the effective capacitance of the capacitor part 202 varies depending upon the state of the transfer gate 203 (on or off).

Figure 13B:
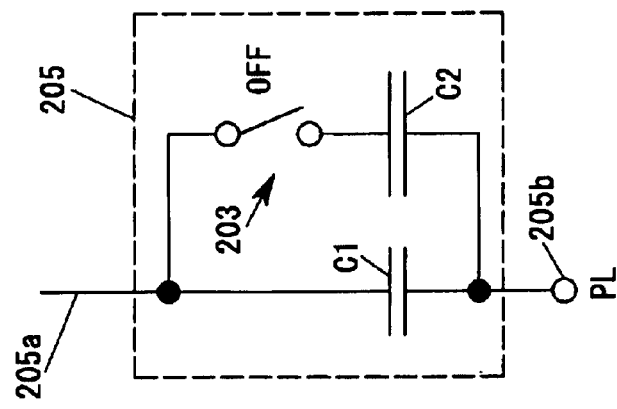
FIG. 13B is a diagram illustrating an equivalent circuit of a nonvolatile memory element 205 at the time when a transfer gate 203 is off.
Figure 13A:
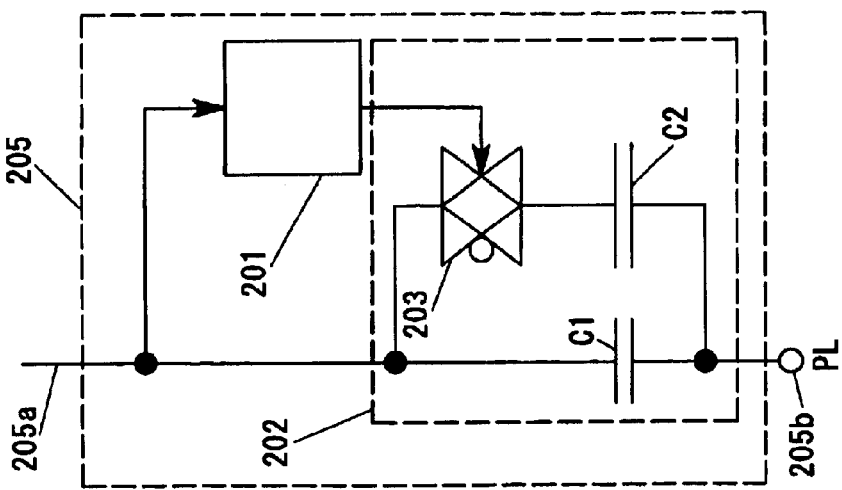
FIG. 13A is a diagram illustrating an example of a nonvolatile memory element without a ferroelectric capacitor.

FIG. 13B is a diagram illustrating an equivalent circuit of the nonvolatile memory element 205 at the time when the transfer gate 203 is off. In this case, the effective capacitance of the capacitor part 202 is "C1", which is the capacitance of the capacitor C1.

FIG. 13C is a diagram illustrating an equivalent circuit of the nonvolatile memory element 205 at the time when the transfer gate 203 is on. In this case, the effective capacitance of the capacitor part 202 is "C1+C2", which is the combined capacitance when the capacitors C1 and C2 are connected in parallel.

Namely, depending upon the state of the transfer gate 203 (on or off), the effective capacitance of the capacitor part 202 is the combined capacitance of the capacitors C1 and C2 or the capacitance of the capacitor C1 alone.

When a reading signal is applied to the other end 205b of the nonvolatile memory element 205, an electric charge corresponding to the effective capacitance of the capacitor part 202 is discharged to the one end 205a of the nonvolatile memory element 205. The capacitances of the capacitors C1 and C2 are determined such that the discharged electric charge can generate a voltage higher or lower than the threshold voltage of a first inverter circuit (the inverter circuit 7 shown in FIG. 1, for example) depending upon the effective capacitance.

Data corresponding to switching data recorded in the switching data recording part 201 can therefore be restored in the data holding circuit.

Namely, the nonvolatile memory element 205 can be described as follows.

The nonvolatile memory element 205 has a nonvolatile recording part and a capacitor part.

The nonvolatile recording part records data corresponding to date existing in the data holding circuit in a nonvolatile manner with an end of the nonvolatile recording part connected to an input node of a first inverter circuit at the time of writing data.

The capacitor part exhibits an effective capacitance corresponding to data recorded in the nonvolatile recording part in a nonvolatile manner at the time of restoring data, and discharges an electric charge which corresponds to the effective capacitance and which can generate a voltage higher or lower than the threshold voltage of the first inverter circuit at the input node of the first inverter circuit to the input node of the first inverter circuit when an end of the capacitor part is connected to the input node of the first inverter circuit and a reading signal is applied to the other end thereof at the time of restoring data.

As described previously, the data holding device according to this invention has a data holding circuit and a nonvolatile memory element.

The data holding circuit holds data when first and second inverter circuits are connected in a loop at the time of latching data.

The nonvolatile memory element records a nonvolatile state corresponding to data existing in the data holding circuit with an end of the nonvolatile memory element connected to an input node of the first inverter circuit at the time of writing data. The nonvolatile memory element discharges an electric charge which corresponds to the nonvolatile state recorded therein and which can generate a voltage higher or lower than the threshold voltage of the first inverter circuit at the input node of the first inverter circuit to the input node of the first inverter circuit when an end of the nonvolatile memory element is connected to the input node of the first inverter circuit and a reading signal is applied to the other end thereof at the time of restoring data.

The data holding circuit also has a loop switching gate. The loop switching gate is interposed between a nonvolatile memory element connecting node defined as a connecting node between the input node of the first inverter circuit and the one end of the nonvolatile memory element, and an output node of the second inverter circuit. The loop switching gate is on at the time of latching and writing date, and off in applying the reading signal and on after a lapse of a predetermined period of time at the time of restoring data.

A data holding method according to this invention has a step of preparing a data holding device. The data holding device has a data holding circuit and a nonvolatile memory element. The data holding circuit holds data when first and second inverter circuits are connected in a loop at the time of latching data. The nonvolatile memory element has one end which is connected to an input node of the first inverter circuit at least in writing and restoring data. The data holding circuit has a loop switching gate. The loop switching gate is interposed between a nonvolatile memory element connecting node defined as a connecting node between the input node of the first inverter circuit and the one end of the nonvolatile memory element, and an output node of the second inverter circuit.

This data holding method has a step of recording a nonvolatile state corresponding to data existing in the data holding circuit into the nonvolatile memory element with the one end of the nonvolatile memory element connected to the input node of the first inverter circuit at the time of writing data.

This data holding method also has a step of restoring data corresponding to a nonvolatile state recorded in the nonvolatile memory element in the data holding circuit, including the steps of switching off the loop switching gate with the power source of the data holding device on, allowing the nonvolatile memory element to discharge an electric charge which corresponds to a nonvolatile state recorded therein and which can generates a voltage higher or lower than the threshold voltage of the first inverter circuit at the input node of the first inverter circuit to the input node of the first inverter circuit by connecting the one end of the nonvolatile memory element to the input node of the first inverter circuit and applying a reading signal to the other end of the nonvolatile memory element, and connecting the first and second inverter circuits in a loop by switching on the loop switching gate after a lapse of a predetermined period of time at the time of restoring data.

Thus, the data holding device and the data holding method according to this invention need only one nonvolatile memory element.

To restore data recorded in the nonvolatile memory element in the data holding circuit, it is only necessary to perform the following simple operation. It includes the steps of switching off the loop switching gate with the power source of the data holding device on, applying a reading signal to the nonvolatile memory element, and switching on the loop switching gate after a lapse of predetermined period of time. Thus, peripheral circuits and control lines can be simplified. As a result, the circuit area can be small. Also, there is no need for fine timing control.

Also, since the loop switching gate is off with the power source of the data holding device on and then a reading signal is applied to the nonvolatile memory element, an electric charge generated by application of the reading signal is not lost through the loop switching gate. Thus, data can be restored accurately.

The data holding device according to this invention also has a data switching gate. The data switching gate has an end connected to the nonvolatile memory element connecting node and the other end connected to a data transmitting path connecting the data holding circuit and the outside. The data switching gate is on at the time of transmitting data, and off while the loop switching gate is off and on after a lapse of a predetermined period of time at the time of restoring data.

The data holding device for use in the data holding method according to this invention also has a data switching gate. The data switching gate has an end connected to the nonvolatile memory element connecting node and the other end connected to a data transmitting path connecting the data holding circuit and the outside. The data switching gate is on at the time of transmitting data.

This data holding method has a step of restoring data corresponding to a nonvolatile state recorded in the non-volatile memory element in the data holding circuit, including the steps of switching off the loop switching gate with the power source of the data holding device on, allowing the nonvolatile memory element to discharge an electric charge which corresponds to a nonvolatile state recorded therein and which can generate a voltage higher or lower than the threshold voltage of the first inverter circuit at the input node of the first inverter circuit to the input node of the first inverter circuit by connecting the one end of the nonvolatile memory element to the input node of the first inverter circuit and applying a reading signal to the other end of the nonvolatile memory element, connecting the first and second inverter circuits in a loop by switching on the loop switching gate with the data switching gate kept off after a lapse of a predetermined period of time, and switching on the data switching gate at the time of restoring data.

Namely, in the data holding device and the data holding method according to this invention, when data is restored in the data holding circuit, the data switching gate is off while the loop switching gate is off and then on after a lapse of a predetermined period of time after the loop switching gate has been on.

Thus, new data is received after data is reliably restored in the data holding circuit. Namely, data can be restored accurately without the influence of newly inputted data.

Also, since the loop switching gate and the data switching gate are off with the power source of the data holding device on and then a reading signal is applied to the nonvolatile memory element, an electric charge generated by application of the reading signal is not lost through the loop switching gate or the data switching gate. Thus, data can be restored more accurately.

The data holding device according to this invention has a limiter element.

The limiter element has a connecting-node-side semiconductor region connected to the nonvolatile memory element connecting node, a base semiconductor region to which is applied a power source voltage having a polarity which is the same as that of the electric charge discharged to the nonvolatile memory element connecting node by application of a reading signal, and a junction at which the connecting-node-side semiconductor region is joined to the base semiconductor region in the forward direction for the discharged electric charge.

Thus, when the electric charge discharged to the nonvolatile memory element connecting node by application of a reading signal is excessively large and the voltage generated at the nonvolatile memory element connecting node by the electric charge may exceed the power source voltage, the excess electric charge is discharged to the power source through the connecting-node-side semiconductor region, the junction and the base semiconductor region of the limiter element.

Thus, the voltage at the nonvolatile memory element connecting node does not exceed the power source voltage. As a result, operation trouble caused by excessive voltage can be prevented. Namely, even when there is non-uniformity in the voltage/electric charge characteristics of the nonvolatile memory element, stable operation can be achieved in spite of the non-uniformity.

In the data holding device according to this invention, the loop switching gate and/or the data switching gate have a limiter field-effect transistor as a limiter element.

The limiter field-effect transistor has a source/drain region as a connecting-node-side semiconductor region connected to the nonvolatile memory element connecting node, a base semiconductor region to which is applied a power source voltage having a polarity which is the same as that of the electric charge discharged to the nonvolatile memory element connecting node by application of a reading signal, and a junction at which the source/drain region is joined to the base semiconductor region in the forward direction for the discharged electric charge.

Thus, by using the field-effect transistor constituting the loop switching gate and/or the data switching gate as a limiter field effect transistor (limiter element), operation trouble caused by excessive voltage can be prevented without an exclusive limiter element.

The data holding device according to this invention also has a precharge circuit. The precharge circuit discharges the electric charge in the nonvolatile memory element connecting node prior to the application of a reading signal.

Thus, data can be restored after the unnecessary electric charges remaining in the nonvolatile memory element connecting node has been forcibly discharged. Thus, data can be restored accurately. Also, a cycle of recording and restoring data can be executed within a short period of time.

In the data holding device according to this invention, the nonvolatile memory element connecting node is connected to an input-side data transmitting path of data transmitting paths connecting the data holding circuit and the outside.

Also, a correcting inverter circuit is interposed in each of the input-side data transmitting path and an output-side data transmitting path.

Thus, the logic value of the nonvolatile memory element connecting node and the logic value of the output node of the correcting inverter circuit provided in the output-side data transmitting path are equal. For example, in the case where the ground potential is logic "L", when the electric charge in the nonvolatile memory element connecting node is discharged by the precharge circuit and as a result, the logic value of the nonvolatile memory element connecting node becomes logic "L", the logic value of the output from the data holding device also becomes logic "L".

Thus, since the output from the data holding device corresponding to a precharge, namely reset, can be logic "L", a logic circuit using the output from the data holding device can be easily constituted.

In the data holding device and the data holding method according to this invention, the nonvolatile memory element includes a ferroelectric capacitor. Also, the nonvolatile state corresponds to the polarization state of the ferroelectric capacitor.

Thus, a nonvolatile memory element which is simple in structure and in which data can be written at high speed with a writing signal of a low voltage can be achieved.

In the claims and the specification, a "nonvolatile memory element" means an element in which data can be recorded in a nonvolatile manner and exhibits at least two nonvolatile states corresponding to the values of data.

The "time of latching data" is a state where data is held in the data holding circuit by connecting the first and second inverter circuits in a loop.

The "time of transmitting data" is a state where data from the outside can be transmitted to the data holding circuit.

The "time of writing data" is the time at which an operation to write a nonvolatile state corresponding to data into the nonvolatile memory element is executed.

The "time of restoring data" is a period of time for which a series of operations to restore data is executed.

The "data existing in the data holding circuit" is not limited to data held in the data holding circuit (latched data at the time of latching data). Thus, data passing through the data holding circuit (data being transmitted at the time of transmitting data) are included in the "data existing in the data holding circuit".

The "connecting-node-side semiconductor region" is a semiconductor region which constitutes a limiter element and is connected to the nonvolatile memory element connecting node.

The "source/drain region" means "a source region or a drain region".

The "base semiconductor region" is a semiconductor region which has conductivity type which is different from that of the connecting-node-side semiconductor region and which is formed in direct contact with the connecting-node-side semiconductor region.

The invention disclosed in this application can be understood as (I) and (II) below. (I)

A data holding device comprising a data holding circuit in which data are held by connecting first and second inverter circuits in a loop at the time of latching data, and a nonvolatile memory element which records a nonvolatile state corresponding to data stored in the data holding circuit when one end of the nonvolatile memory element is connected to an input node of the first inverter circuit and a writing signal is applied to the other end thereof at the time of writing data, and which discharges an electric charge which corresponds to the nonvolatile state recorded in the nonvolatile memory element and can generate a voltage higher or lower than the threshold voltage of the first inverter circuit at the input node of the first inverter circuit to the input node of the first inverter circuit when said one end is connected to the input node of the first inverter circuit and a reading signal is applied to said other end at the time of restoring data, the data holding circuit having a loop switching gate which is interposed between a nonvolatile memory element connecting node defined as a connecting node between the input node of the first inverter circuit and the one end of the nonvolatile memory element, and an output node of the second inverter circuit, and which is on at the time of latching and writing data, and off in applying the reading signal and on after a lapse of a predetermined period of time at the time of restoring data. (II)

A data holding method comprising:

a step of preparing a data holding device having a data holding circuit in which data are held by connecting first and second inverter circuits in a loop at the time of latching data, and a nonvolatile memory element having an end which is connected to an input node of the first inverter circuit at least in writing and restoring data, the data holding circuit having a loop switching gate interposed between a nonvolatile memory element connecting node defined as a connecting node between the input node of the first inverter circuit and the one end of the nonvolatile memory element, and an output node of the second inverter circuit;

a step of recording a nonvolatile state corresponding to data held in the data holding circuit in the nonvolatile memory element, including the steps of switching on the loop switching gate, connecting the one end of the nonvolatile memory element to the input node of the first inverter circuit, and applying a writing signal to the other end of the nonvolatile memory element at the time of writing data; and a step of restoring data corresponding to a nonvolatile state recorded in the nonvolatile memory element in the data holding circuit, including the steps of switching off the loop switching gate with the power source of the data holding device on, allowing the nonvolatile memory element to discharge an electric charge which corresponds to the nonvolatile state recorded therein and which can generate a voltage higher or lower than the threshold voltage of the first inverter circuit at the input node of the inverter circuit to the input node of the first inverter circuit by connecting the one end of the nonvolatile memory element to the input node of the first inverter circuit and applying a reading signal to the other end of the nonvolatile memory element, and connecting the first and second inverter circuits in a loop by switching on the loop switching gate after a lapse of a predetermined period of time at the time of restoring data.

In the data holding device and the data holding method constituted as (I) and (II) above, data can be recorded by a simple operation of applying a writing signal to the other end of the nonvolatile memory element. Thus, data can be recorded easily. Also, a nonvolatile state corresponding to data latched in the data holding circuit can be recorded in the nonvolatile memory element, data in a stable state can be recorded with high reliability.

Figure 14:
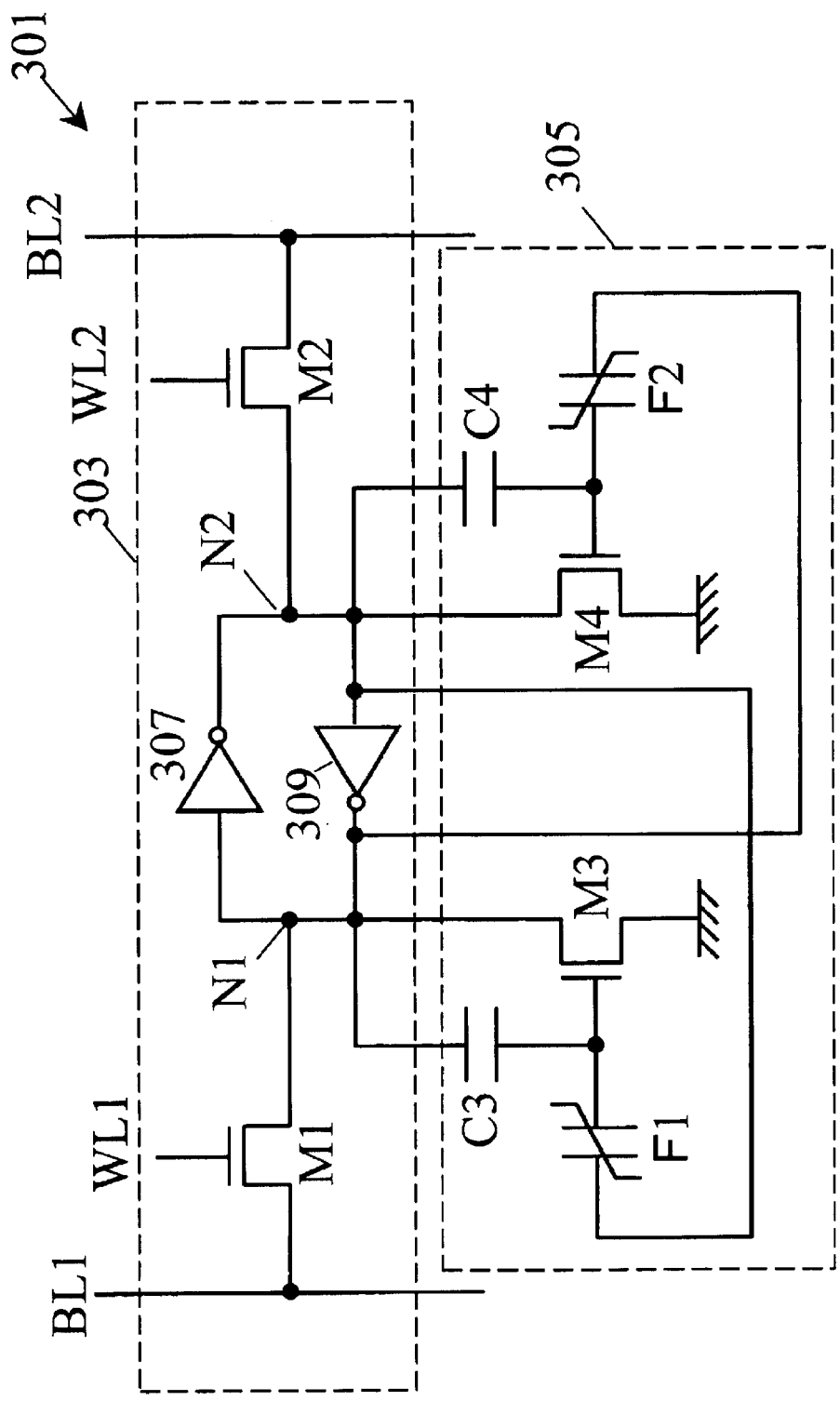
FIG. 14 is a circuit diagram illustrating a data holding device 301 according to another embodiment of this invention.

FIG. 14 is a circuit diagram illustrating a data holding device 301 according to another embodiment of this invention. The data holding device 301 has a data holding circuit 303 and a nonvolatile memory part 305.

The data holding circuit 303 has inverter circuits 307 and 309 connected in a loop. Memory nodes N1 and N2 as output nodes of the inverter circuit are connected to bit lines BL1 and BL2 via transistors M1 and M2, respectively.

By turning on the transistors M1 and M2 by controlling word lines WL1 and WL2, data can be read from or written in the data holding circuit 303.

The nonvolatile memory part 305 is constituted of field-effect transistors M3 and M4 as the variable resistance element, ferroelectric capacitors F1 and F2, and capacitors C3 and C4. The ferroelectric capacitor F1 has one end connected to a gate electrode of the field-effect transistor M3, and the ferroelectric capacitor F2 has one end connected to a gate electrode of the field-effect transistor M4. The other end of the ferroelectric capacitor F1 as a first ferroelectric capacitor is connected to the memory node N2, and the other end of the ferroelectric capacitor F2 as a second ferroelectric capacitor is connected to the memory node N1. One end of the capacitor C3 is connected to the gate electrode of the field-effect transistor M3, and the other end of the capacitor C3 is connected to the memory node N1. One end of the capacitor C4 is connected to the gate electrode of the field-effect transistor M4, and the other end of the capacitor C4 is connected to the memory node N2.

Figure 15:
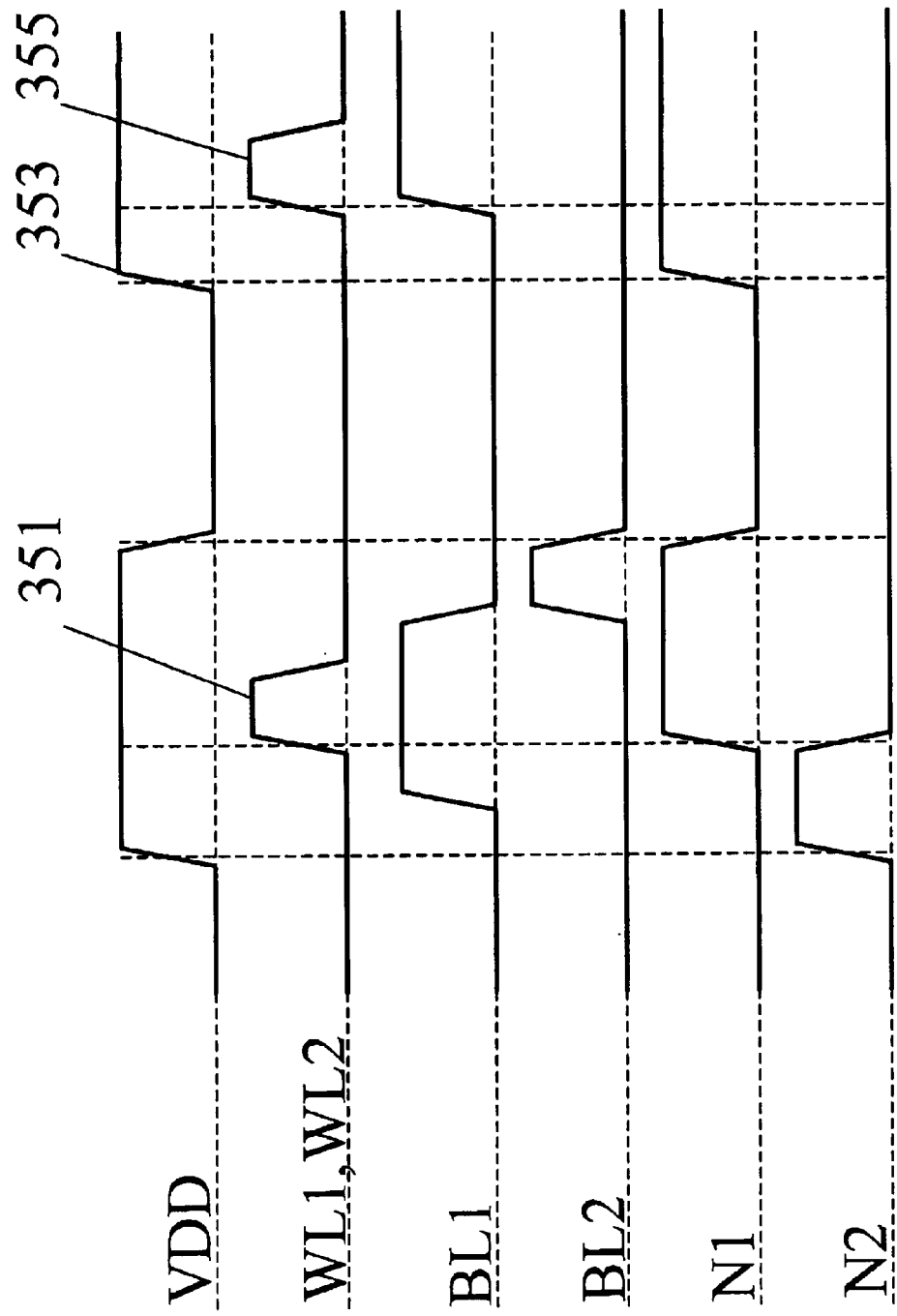
FIG. 15 is a timing chart for explaining the operation of the data holding device 301 shown in FIG. 14.
Figure 16A:
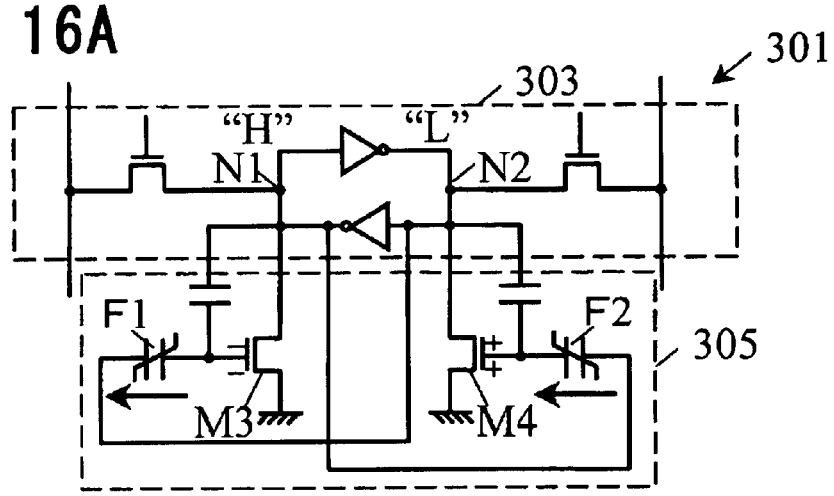
FIG. 16A is a diagram for explaining the operation to store data in a nonvolatile memory part 305.
Figure 16B:
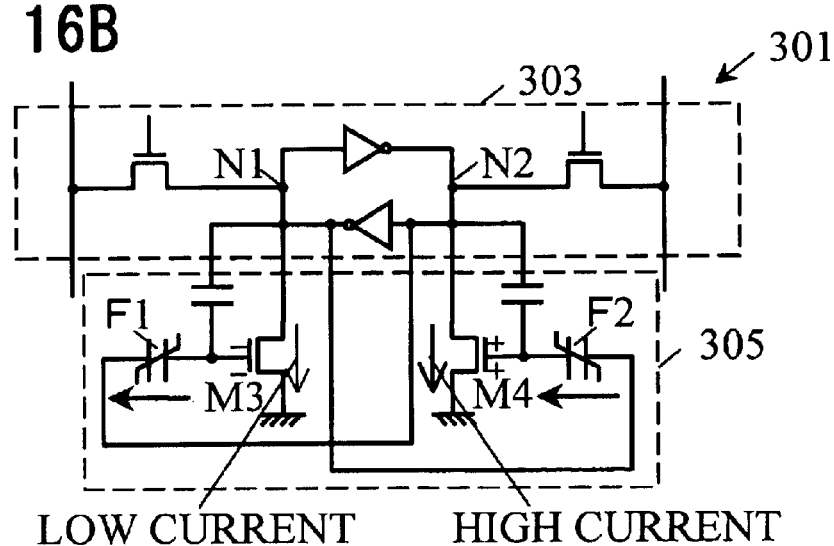
FIG. 16B and FIG. 16C are diagrams for explaining the operation to restore data from the nonvolatile memory part 305.
Figure 16C:
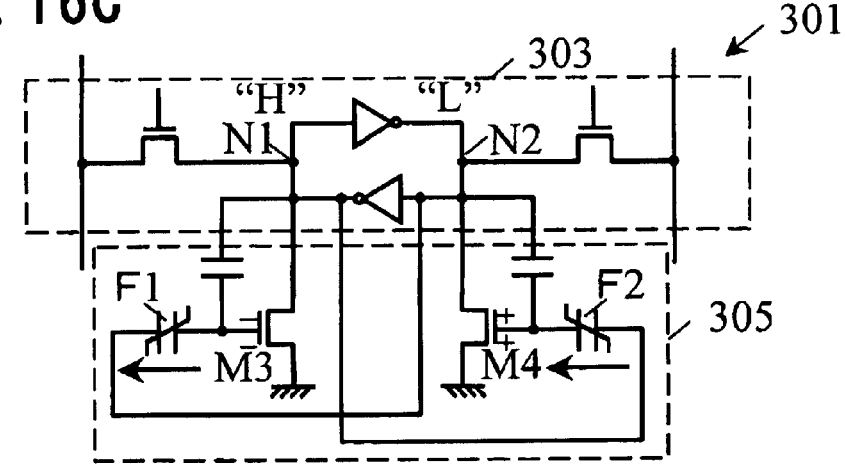

FIG. 15 is a timing chart for explaining the operation of the data holding device 301 shown in FIG. 14. FIG. 16A is a diagram for explaining the operation to record data in the nonvolatile memory part 305, and FIG. 16B and FIG. 16C are diagrams for explaining the operation to restore data from the nonvolatile memory part 305. Descriptions will be made of the operation of the data holding device 301 with reference to FIG. 14 and FIG. 15 and FIG. 16A to FIG. 16C.

As shown in FIG. 15, data at level "H" and data at level "L" are prepared for the bit lines BL1 and BL2, respectively. Then, when writing signals 351 are applied to the word lines WL1 and WL2, the data on the bit lines are written in the inverter loop of the data holding circuit 303.

At this time, a polarization state oriented to the left in the drawing is generated in the ferroelectric capacitors F1 and F2 as shown in FIG. 16A.

Then, the power source voltage VDD is interrupted as shown in FIG. 15. Even when the power source voltage VDD is interrupted, a residual polarization corresponding to the polarization direction is maintained in the ferroelectric capacitors F1 and F2. Also, since movement of electric charge is generated in a direction to cancel the residual polarizations, a negative electric charge is generated at the gate electrode of the field-effect transistor M3 and a positive electric charge is generated at the gate electrode of the field-effect transistor M4.

Figure 17:
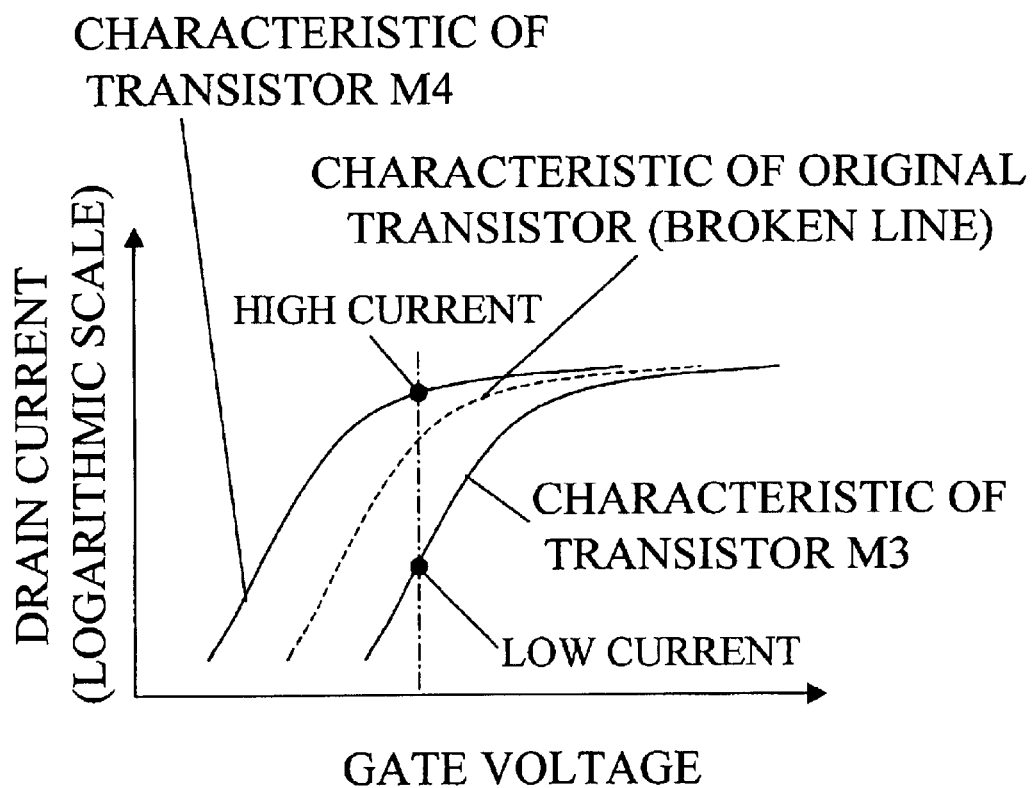
FIG. 17 is a graph showing the changes in apparent threshold voltages in field-effect transistors M3 and M4 of the nonvolatile memory part 305.

Thus, the apparent threshold voltage of the field-effect transistor M3 becomes high and the apparent threshold voltage of the field-effect transistor M4 becomes low as shown in FIG. 17.

When the power source voltage VDD is turned on again (see 353 in FIG. 15), the potentials in the memory nodes N1 and N2 increase. However, since the apparent threshold voltage of the field-effect transistor M4 is low as shown in FIG. 16B, the current flowing in the field-effect transistor M4 is high and the potential increasing rate in the memory node N2 is lower than that in the memory node N1.

The thus generated potential difference between the memory nodes N1 and N2 is amplified by the inverter loop, and the memory node N1 is fixed at level "H" and the memory node N2 is fixed at level "L".

Namely, data corresponding to the polarizations of the ferroelectric capacitors F1 and F2 can be restored.

When reading signals 355 are applied to the word line WL1 and WL2, data restored in the bit lines BL1 and BL2 can be taken out as shown in FIG. 15.

In general, when a field-effect transistor with a low threshold voltage is used in a circuit, leak current increases. However, in the circuit constituted as described above, leak current is not generated since the memory node N2 to which the field-effect transistor M4 with a low threshold voltage is connected is at level "L".

Figure 18:
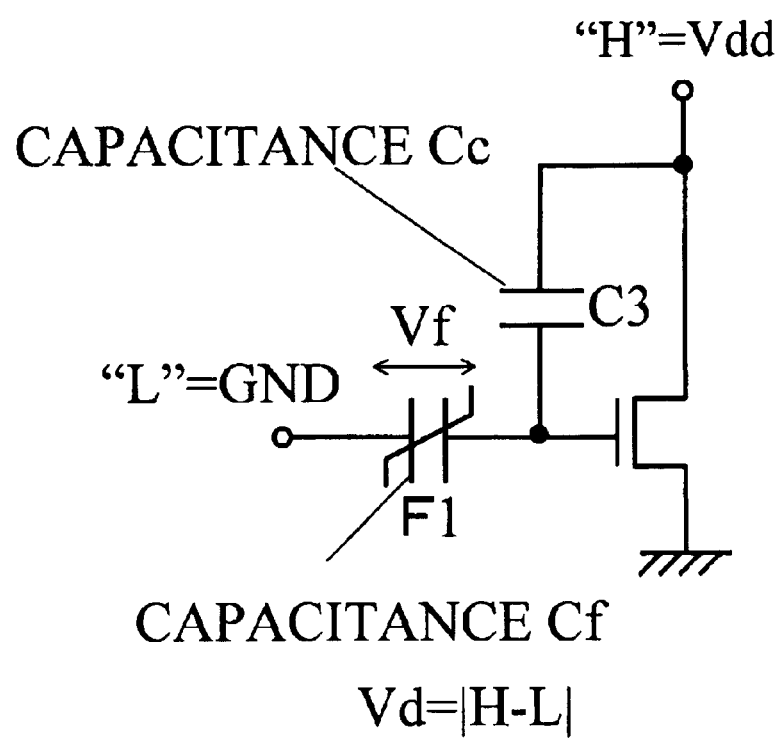
FIG. 18 is a diagram for explaining the voltage applied across a ferroelectric capacitor F1.

FIG. 18, which is a diagram for explaining the voltage applied across the ferroelectric capacitor F1, is an enlarged view of part of FIG. 16A, which is a diagram for explaining the operation to store data in the nonvolatile memory part 305.

In the drawing, Vd is the absolute value of the difference between the ground potential GND as a first reference potential and the power source potential Vdd as a second reference potential, Vf is the absolute value of a voltage applied across the ferroelectric capacitor F1, Cf is the equivalent capacitance of the ferroelectric capacitor F1, and Cc is the capacitance of the capacitor C3.

The voltage Vf applied to the ferroelectric substance is represented by the equation (1);

$$Vf = Cc/(Cf+Cc) \cdot Vd \tag{1}$$

The capacitance between the gate electrode, and the source and drain of the field-effect transistor M3, and the capacitance between the gate electrode and the semiconductor substrate are ignored since they are much smaller than the capacitance of the ferroelectric capacitance Cf and the capacitor capacitance Cc.

To invert the polarization of the ferroelectric capacitor F1, it is necessary for the ferroelectric capacitor F1 to be applied a voltage larger than the coercive voltage Vfc of the ferroelectric capacitor F1. Thus, the relation (2) must be satisfied.

$$Vf = Cc/(Cf+Cc) \cdot Vd > Vfc \tag{2}$$

By using the capacitors C3 and C4 as described above, a voltage is applied to the ferroelectric capacitors F1 and F2 with high efficiency and it is possible to improve reliability in holding data.

Although the nonvolatile memory part 305 is constituted of a pair of ferroelectric capacitors F1 and F2, a pair of field-effect transistors M3 and M4, and a pair of capacitors C3 and C4 in this embodiment, this invention is not limited to that. For example, the nonvolatile memory part 305 may be constituted of one ferroelectric capacitor F1, one field-effect transistor M3, and one capacitor C3.

Figure 19:
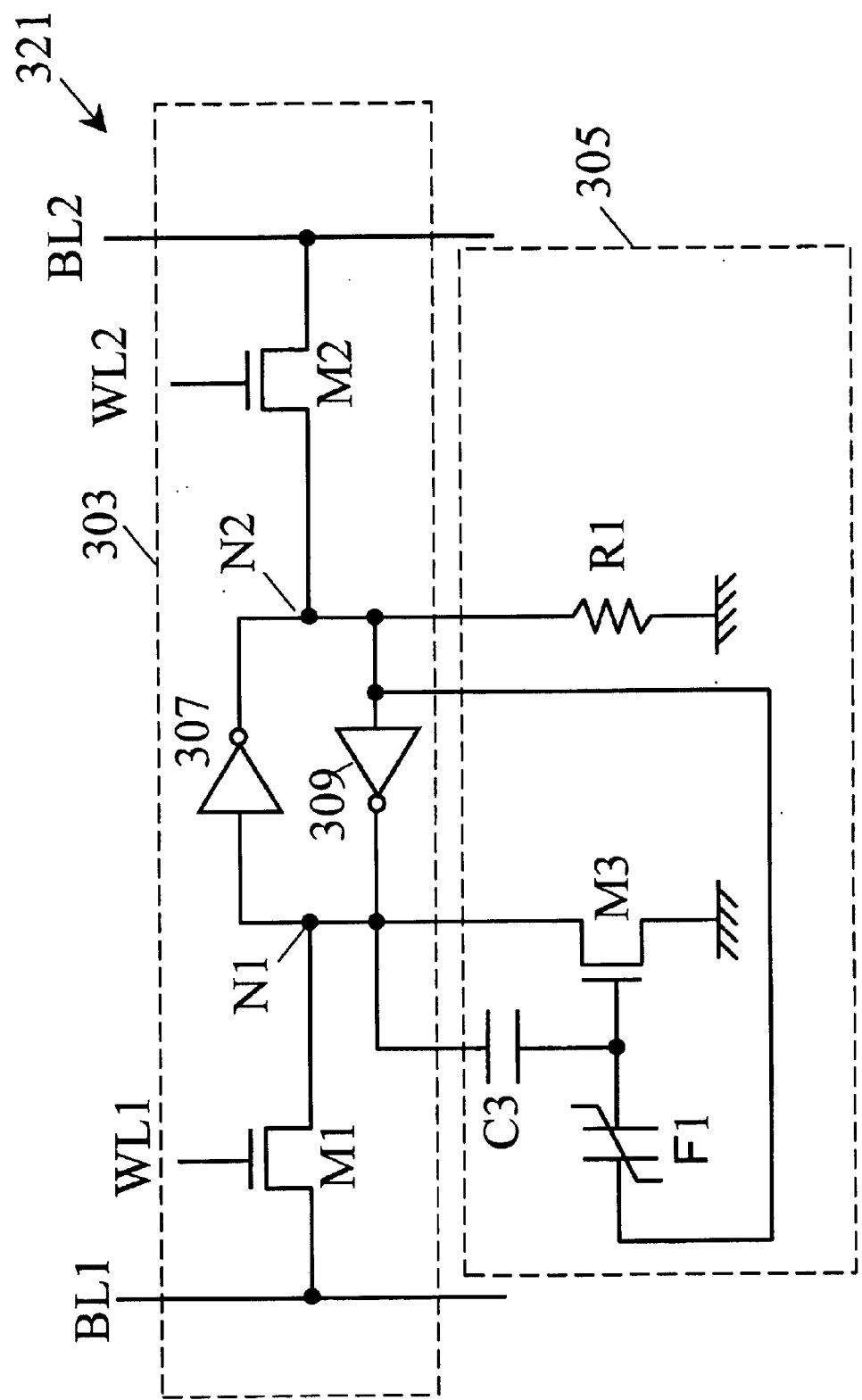
FIG. 19 is a circuit diagram illustrating a data holding device 321 according to another embodiment of this invention.

FIG. 19 is a circuit diagram illustrating a data holding device 321 according to another embodiment of this invention. The data holding device 321 has the same constitution as the data holding device 301 shown in FIG. 14 except that the nonvolatile memory part 305 is constituted of one ferroelectric capacitor F1, one field-effect transistor M3, one capacitor C3, and one resistance R1.

The current flowing between the source and drain of the field-effect transistor M3, the apparent threshold voltage of which has been decreased, is referred to as I+. The current flowing between the source and drain of the field-effect transistor M3, the apparent threshold voltage of which has been increased, is referred to as I−. When the resistance value of the resistance R1 is determined such that the current IR1 which flows through the resistance R1 satisfies the relation (3) when the power source voltage VDD is turned on again, data can be restored.

$$I+ > IR1 > I- \tag{3}$$

A data holding device can therefore be constituted of a small number of parts as compared with the embodiment shown in FIG. 14.

However, a data holding device constituted as above is likely to be affected by fluctuation in the resistance value of the resistance R1 or fluctuation in the threshold voltage of the field-effect transistor M3. Thus, the embodiment shown in FIG. 14 can restore data with higher reliability.

Figure 20:
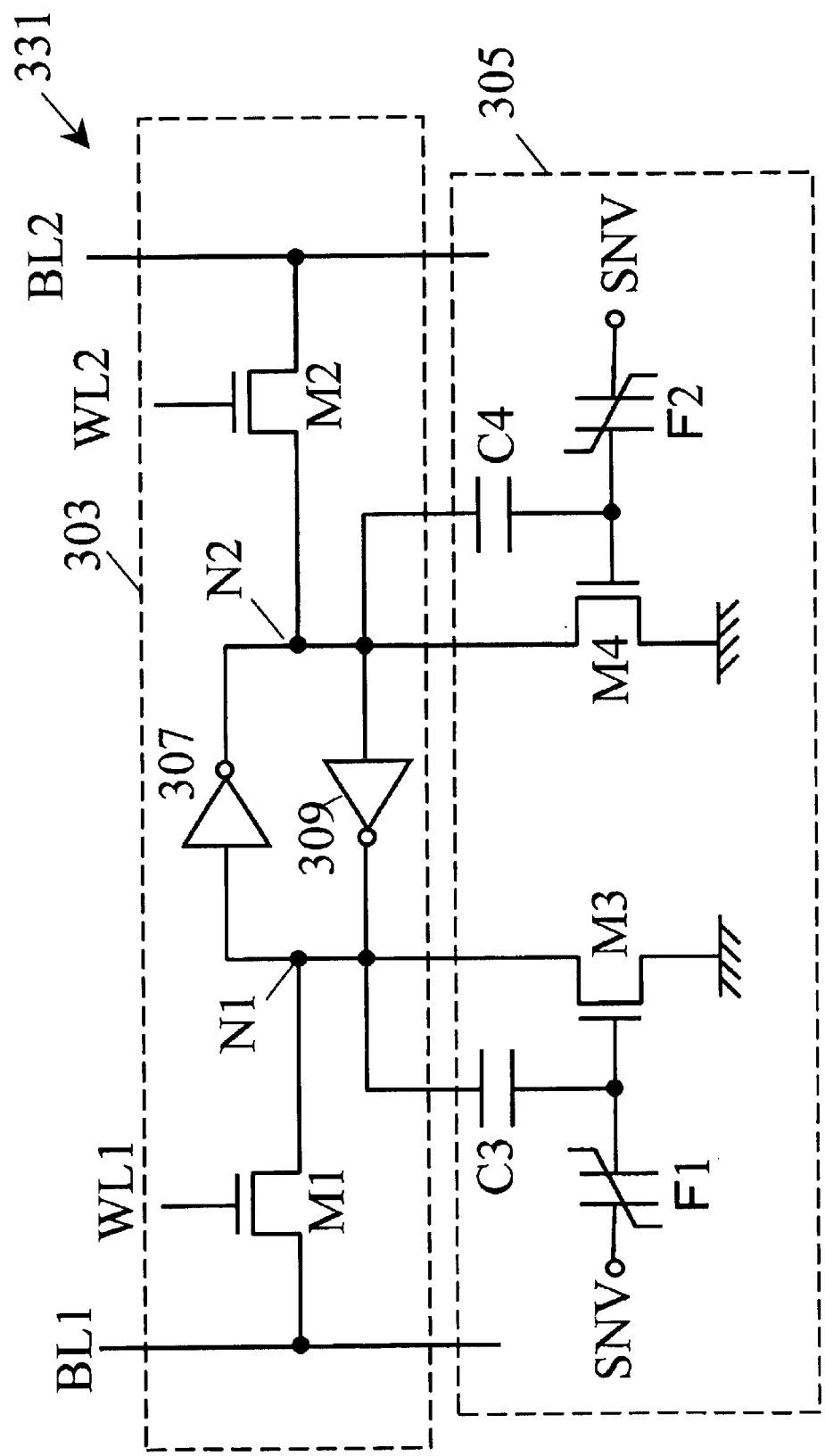
FIG. 20 is a circuit diagram illustrating a data holding device 331 according to another embodiment of this invention.

FIG. 20 is a circuit diagram illustrating a data holding device 331 according to another embodiment of this invention. Nonvolatile memory element writing signals SNV can be applied to ends of the ferroelectric capacitors F1 and F2 of the nonvolatile memory part 305.

Figure 21:
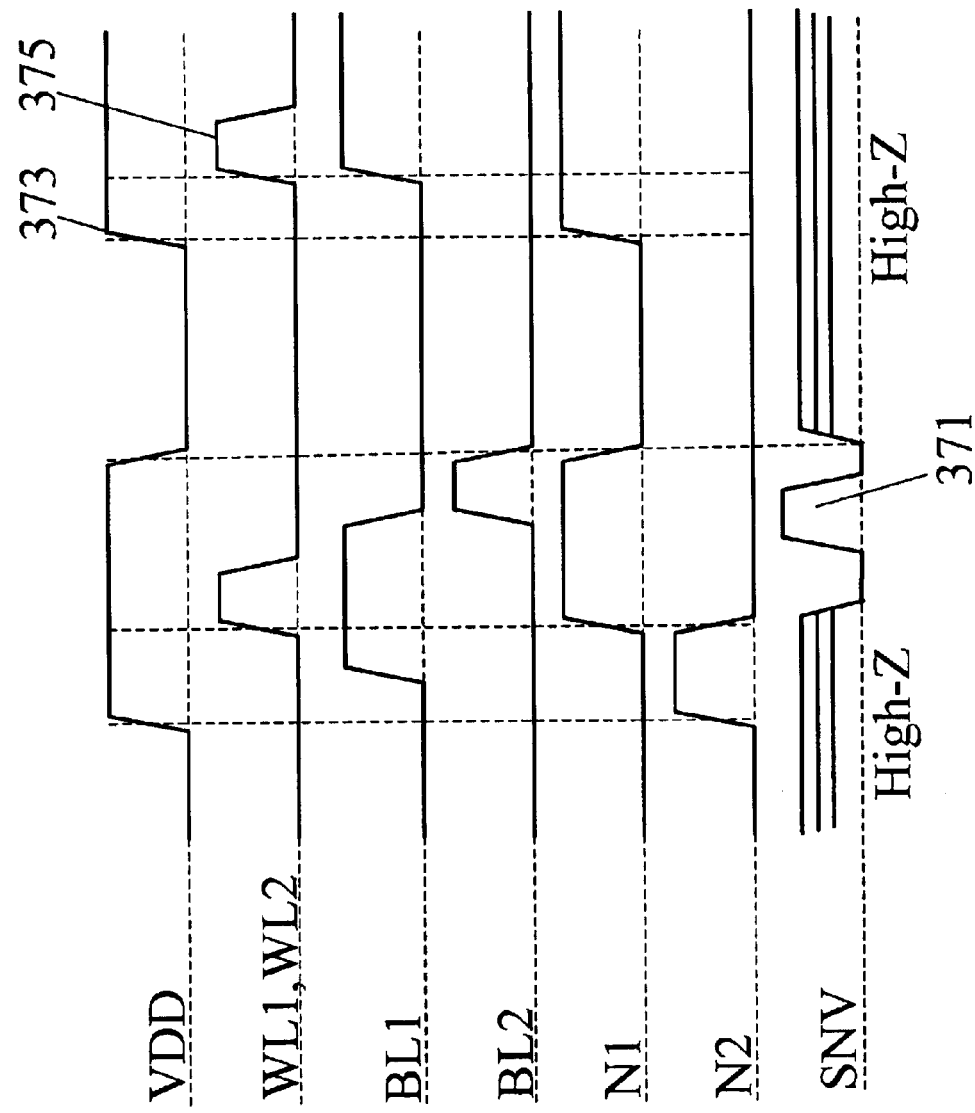
FIG. 21 is a timing chart for explaining the operation of the data holding device 331 shown in FIG. 20.

FIG. 21 is a timing chart for explaining the operation of the data holding device 331 shown in FIG. 20. In the timing chart, the triple lines indicate that the nonvolatile memory element writing signals SNV are in a high-impedance (high-Z) state.

When the nonvolatile memory element writing signals SNV are in a high-impedance state, little voltage is applied to the ferroelectric capacitors F1 and F2. Thus, polarization inversion does not occur and data recorded in the nonvolatile memory part are not changed. In the example shown in FIG. 21, when the nonvolatile memory element writing signals SNV are Low (in a ground potential state), the memory node N1 is High (in a power source potential state). Thus, an electric field directed to the left is applied to the ferroelectric capacitor F1. At this time, since the memory node N2 is Low, almost no electric field is applied to the ferroelectric capacitor F2. When the nonvolatile memory element writing signals SNV are High, an electric field directed to the left is applied to the ferroelectric capacitor F2. Namely, by changing the state of the nonvolatile memory element writing signals SNV, data can be written in the ferroelectric capacitors F1 and F2. Alternatively, the state of the nonvolatile memory element writing signals SNV may be changed from High to Low.

Data in the data holding circuit at an optional time can be thereby selectively stored in the ferroelectric capacitors F1 and F2.

Namely, although data in the data holding device are always written automatically in the ferroelectric capacitors in the embodiment shown in FIG. 14, data is written in the ferroelectric capacitors only when the nonvolatile memory element writing signals are not in a high-impedance state in this embodiment. Thus, the time during which a voltage is applied to the ferroelectric substances can be reduced and the number of times the ferroelectric substances are charged and discharged can be reduced. Therefore, high reliability can be achieved and power consumption of the circuit can be reduced.

Figure 22:
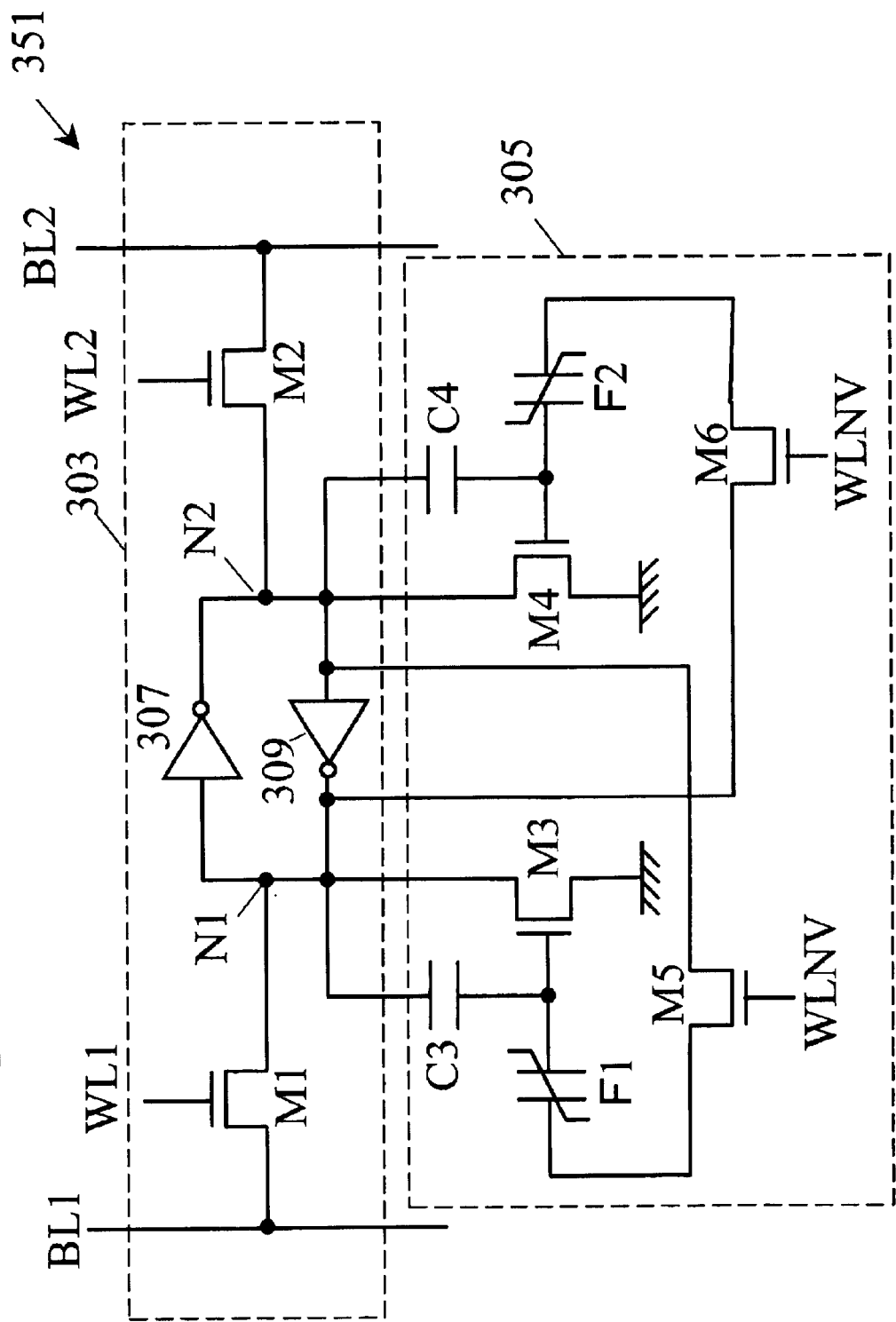
FIG. 22 is a circuit diagram illustrating a data holding device 351 according to another embodiment of this invention.

FIG. 22 is a circuit diagram illustrating a data holding device 351 according to another embodiment of this invention. One end of a ferroelectric capacitor F1 of a nonvolatile memory part 305 is connected to a memory node N2 via a nonvolatile memory element writing transistor MS, and one end of a ferroelectric capacitor F2 of the nonvolatile memory part 305 is connected to a memory node N1 via a nonvolatile memory element writing transistor M6. The nonvolatile memory element writing transistors M5 and M6 have gate electrodes to which nonvolatile memory element writing signal lines WLNV are connected.

Figure 23:
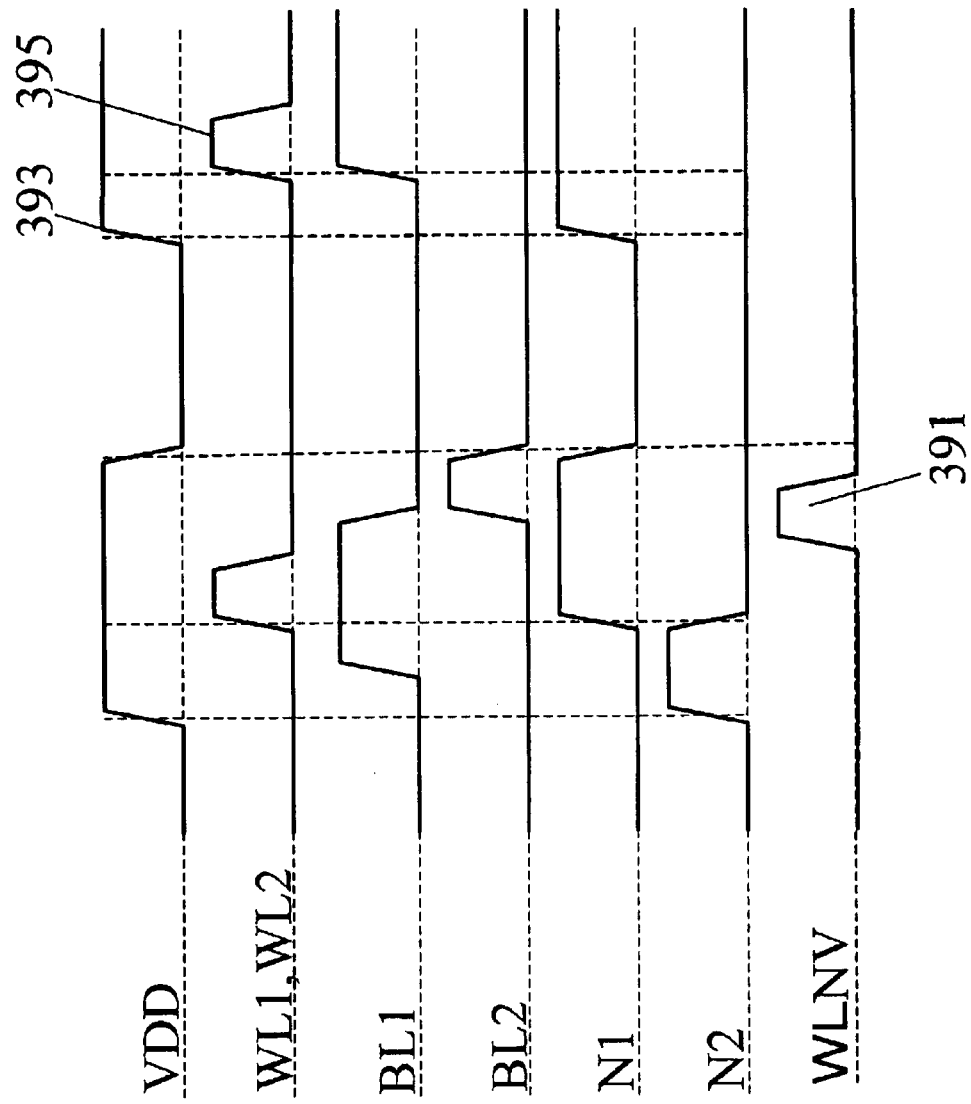
FIG. 23 is a timing chart for explaining the operation of the data holding device 351 shown in FIG. 22.
Figure 24:
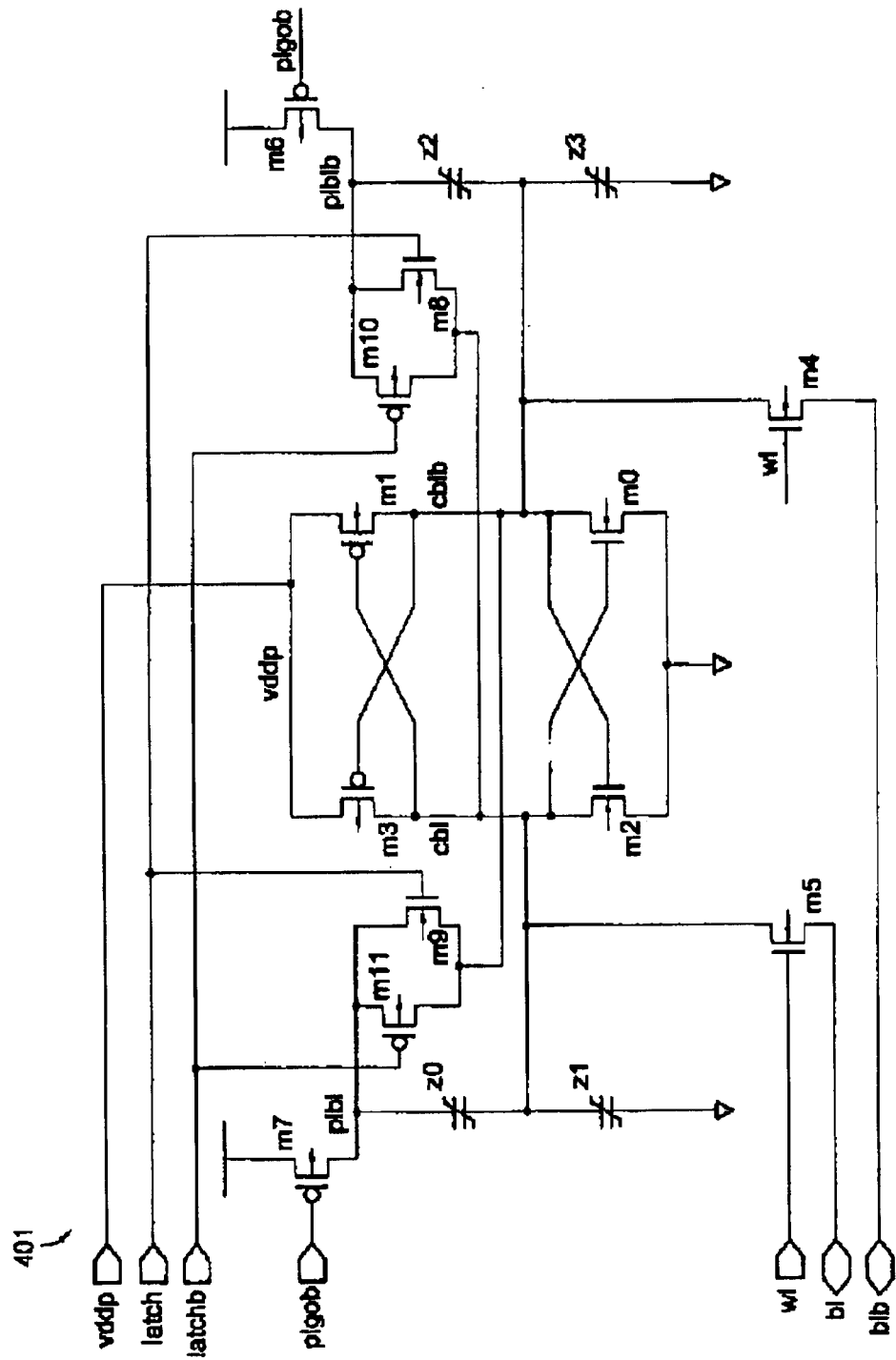
FIG. 24 is a diagram illustrating a conventional circuit 401.
Figure 25:
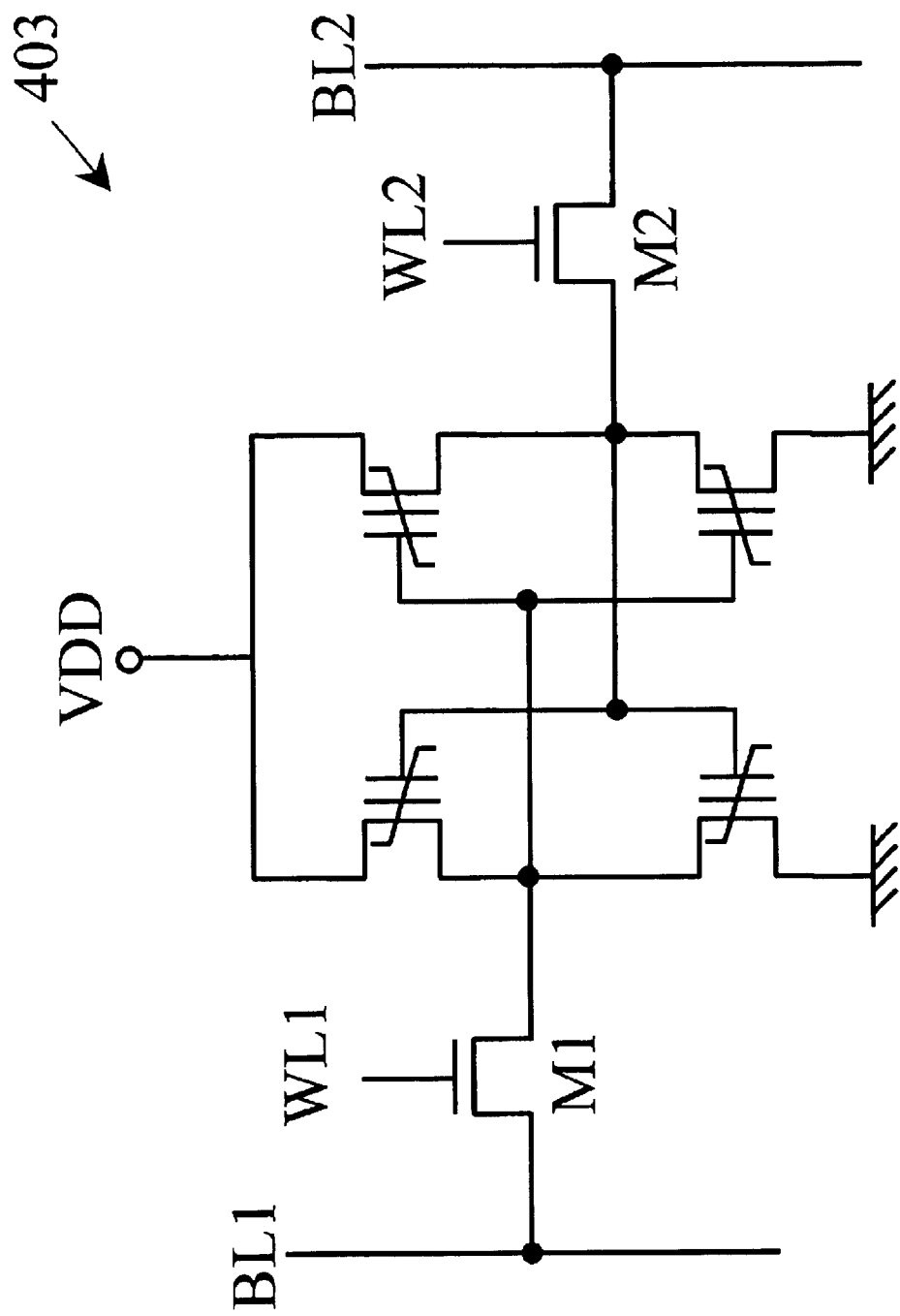
FIG. 25 is a diagram illustrating a conventional circuit 403.

FIG. 23 is a timing chart for explaining the operation of the data holding device 351 shown in FIG. 22.

To write data in the data holding circuit 303 into the ferroelectric capacitors F1 and F2, signals 391 are applied to the nonvolatile memory element writing signal lines WLNV. By applying the signals 391, the nonvolatile memory element writing transistors MS and M6 are turned on and a voltage is applied to the ferroelectric capacitors F1 and F2, whereby the data in the data holding circuit 303 are written into the ferroelectric capacitors F1 and F2 in a nonvolatile manner. When the power source voltage VDD is turned on again (see 393 in FIG. 23), data corresponding to the polarizations of the ferroelectric capacitors F1 and F2 can be restored on the same principle as that of the data holding device 301.

In the data holding device constituted as described above, there is no need to generate a special signal including a high-impedance state except the signals 391 for designating an optional point in time at which data in the data holding device are stored as polarizations of the ferroelectric capacitors. Thus, the circuit configuration in the entire device can be simplified.

Although the nonvolatile memory part 305 is constituted of a pair of ferroelectric capacitors F1 and F2, a pair of field-effect transistors M3 and M4, a pair of capacitors C3 and C4, and a pair of nonvolatile memory element writing transistors M5 and M6 in this embodiment, this invention is not limited to that. For example, the nonvolatile memory part 305 may be constituted of one ferroelectric capacitor F1, one field-effect transistor M3, one capacitor C3 and one nonvolatile memory element writing transistor M5.

Although linear capacitors are used as the capacitors C3 and C4 in the embodiments described previously, this invention is not limited to that. As the capacitors, non-linear capacitors, high dielectric capacitors or ferroelectric capacitors may be used.

Although the data holding circuit and the nonvolatile memory part correspond one to one in the embodiments described previously, this invention is not limited to that. For example, when a plurality of nonvolatile memory parts are connected to the memory node of one data holding circuit, data can be stored in a nonvolatile manner at a plurality of points in time. Also, when a plurality of data holding circuits are switchably connected to one nonvolatile memory part, data in one data holding circuit can be moved to another data holding circuit.

The data holding device and the data holding method according to this invention does not have limited application. This invention is applicable to a part in which data are stored in a logic circuit, such as a latch circuit or a resistor circuit, as well as a memory.

The data holding device according to this invention having a data holding circuit in which data can be held by connecting two inverter circuits in a loop, comprises: a variable resistance element interposed between a memory node of the data holding circuit and a reference potential; and a nonvolatile memory element for controlling the resistance value of the variable resistance element, wherein a state corresponding to data stored in the data holding circuit is recorded in the nonvolatile memory element, and data corresponding to a state recorded in the nonvolatile memory element are restored in the data holding circuit.

Thus, since the potential of the memory node is determined according to the resistance value of the variable resistance element connected to the memory node when the power source is turned on again, data before power off can be restored.

Namely, there can be provided a high-speed and low-power consumption data holding device which can hold data even when the power source is interrupted, and which has high reliability in holding data.

Also, since data can be automatically restored in the data holding circuit when power is supplied, there is no need to generate an exclusive signal and the circuit configuration of the entire device can be simplified.

The data holding device according to this invention has two memory nodes, variable resistance elements interposed between the memory nodes and the reference potential, and nonvolatile memory elements provided for the variable resistance elements, respectively, for controlling the resistance values thereof.

Since the paired variable resistance elements operate in a complementary manner, data can be restored with high reliability.

The data holding device according to this invention has two memory nodes, a variable resistance element interposed between one of the memory nodes and the reference potential, a nonvolatile memory element for controlling the resistance value of the variable resistance element, and a resistance element interposed between the other memory node and the reference potential and having a resistance value within the resistance value of the variable resistance element.

The data holding device can thereby be constituted of a smaller number of parts.

Also, since the data holding device has a field-effect transistors as the variable resistance element, the area of the data holding device can be reduced as the variable resistance element need only a small area.

Also, since the data holding device has a ferroelectric capacitor as the nonvolatile memory element and records data using the ferroelectric capacitor, the data is held even when the power source is interrupted. Also, there is no need to prepare a specially high voltage to control the polarization state of the ferroelectric substance. Since writing data into the ferroelectric substance can be executed at the same speed as reading data therefrom, high speed operation can be achieved.

In the data holding device according to this invention, the variable resistance element is a field-effect transistor and the nonvolatile memory element is a ferroelectric capacitor, the field-effect transistor having a drain and a source, either of which is connected to one of the memory nodes, and a gate electrode connected to one electrode of the ferroelectric capacitor. By applying a potential of the other memory node to the other electrode of the ferroelectric capacitor, a polarization state corresponding to data held in the data holding circuit is recorded in the ferroelectric capacitor.

Thus, since data in the data holding device can be automatically stored as a polarization of the ferroelectric capacitor, there is no need to generate an exclusive signal and the circuit configuration in the entire device can be simplified.

Even when power is accidentally interrupted by power failure or the like, since data immediately before the power off has been recorded, the data before the power off can be restored.

In the data holding device according to this invention, a capacitor is connected between one of the memory nodes and the gate electrode.

Thus, a voltage corresponding to the ferroelectric substance is effectively applied when data is recorded in the ferroelectric capacitor. Since the area of the field-effect transistor as a variable resistance element can be therefore designed small, the area of the data holding device can be small.

Also, since a reverse bias voltage, applied to the ferroelectric capacitor at the time of interrupting data, is small, the reliability in holding data can be improved.

The data holding device according to this invention having a data holding circuit in which data can be held by connecting two inverter circuits in a loop, comprises: a variable resistance element interposed between a memory node of the data holding circuit and a reference potential; and a nonvolatile memory element for controlling the resistance value of the variable resistance element, wherein a state corresponding to data at an optional point in time stored in the data holding circuit can be recorded in the nonvolatile memory element, and data corresponding to a state recorded in the nonvolatile memory element can be restored in the data holding circuit.

Since the data holding device can record a state corresponding to data at an optional point in time, the data holding device can be so constituted that a state corresponding to data at the time when (or immediately before) an error occurs can be recorded in the nonvolatile memory element. This is useful to determine the cause of the error. Also, correct data at the time when (or immediately before) an error occurs can be recorded whenever the error occurs. Thus, processing can be restarted using correct data when the power source is turned on again.

In the data holding device according to this invention, the variable resistance element is a field-effect transistor and the nonvolatile memory element is a ferroelectric capacitor, and the field-effect transistor has a drain or a source, either of which is connected to the memory node, and a gate electrode connected to one electrode of the ferroelectric capacitor. By applying a nonvolatile memory element writing signal to the other electrode of the ferroelectric capacitor, a polarization state corresponding to data at an optional point in time held in the data holding circuit is recorded in the ferroelectric capacitor.

Thus, since data in the data holding circuit at an optional point in time can be automatically stored as a polarization of the ferroelectric capacitor, the data holding device can be so constituted that data at the time when (or immediately before) an error occurs can be recorded in the nonvolatile memory element. Thus, processing can be restarted using correct data at the time when (or immediately before) the error occurs when the power source is turned on again.

Also, since the data holding device has a field-effect transistor as a variable resistance element, the area of the data holding device can be reduced since the variable resistance element needs only a small area.

Also, since the data holding device has a ferroelectric capacitor as a nonvolatile memory element and records data using the ferroelectric capacitor, the data is held even when the power source is interrupted. Also, there is no need to prepare a specially high voltage to control the polarization state of the ferroelectric substance. Since writing data into the ferroelectric polarization can be executed at the same speed as reading data therefrom, high speed operation can be achieved.

The data holding device according to this invention has two memory nodes, and the drain or source of the field-effect transistor is connected to one of the memory nodes, and the electrode of the ferroelectric capacitor, to which a nonvolatile memory element writing signal is applied, is connected to the other memory node via a nonvolatile memory element writing transistor.

Thus, there is no need to generate an exclusive signal except the signal for designating an optional point in time at which data in the data holding device are stored as polarizations of the ferroelectric capacitors. Thus, the circuit configuration in the entire device can be simplified.

The data holding method according to this invention comprises: a step of preparing a data holding device having a data holding circuit in which data can be held by connecting two inverter circuits in a loop, a variable resistance element interposed between a memory node of the data holding circuit and a reference potential, and a nonvolatile memory element for controlling the resistance value of the variable resistance element; a step of automatically writing data in the data holding circuit into the nonvolatile memory element; a step in which the nonvolatile memory element holds the final data in the data holding circuit while the power source of the data holding device is off; and a step of restoring data held in the nonvolatile memory element in the data holding circuit when the power source of the data holding device is restored.

Thus, since there is no need to supply electric power to hold data, the power consumption of the device can be reduced. Also, since data are automatically written in the nonvolatile memory element, the data can be restored when the power supply is restored after an accidental power off (power failure, for example). Thus, there is no need to perform initialization or execute recalculation.

The data holding method according to this invention comprises: a step of preparing a data holding device having a data holding circuit in which data can be held by connecting two inverter circuits in a loop, a variable resistance element interposed between a memory node of the data holding circuit and a reference potential, and a nonvolatile memory element for controlling the resistance value of the variable resistance element; a step of writing data at an optional point in time in the data holding circuit into the nonvolatile memory element; a step in which the nonvolatile memory element holds the data written therein while the power source of the data holding device is off; and a step of restoring data held in the nonvolatile memory element in the data holding circuit when the power source of the data holding device is restored.

Thus, since there is no need to supply electric power to hold data, the power consumption of the device can be reduced. Also, since data in the data holding device at an optional point in time are held in the nonvolatile memory element, data at the time when (or immediately before) an error occurs can be recorded in the nonvolatile memory element. Thus, processing can be restarted using correct data at the time when (or immediately before) an error occurs when the power source is turned on again.

In the above description, this invention has been described as preferred embodiments. It is to be understood that the terminology employed herein is for the purpose of description and not of limitation. It is also to be understood that various modification can be made without departing from the scope and sprit of this invention within the scope of the appended claims.

What is claimed is:

1. A data holding device comprising:
    a data holding circuit in which data are held by connecting first and second inverter circuits in a loop at the time of latching data; and
    a nonvolatile memory element which records a nonvolatile state corresponding to data existing in said data holding circuit with one end of the nonvolatile memory element connected to an input node of said first inverter circuit at the time of writing data, and which discharges an electric charge which corresponds to said nonvolatile state recorded in the nonvolatile memory element and which can generate a voltage higher or lower than the threshold voltage of said first inverter circuit at said input node of said first inverter circuit to said input node of said first inverter circuit when said one end is connected to said input node of said first inverter circuit and a reading signal is applied to the other end of the nonvolatile memory element at the time of restoring data,
    said data holding circuit having a loop switching gate which is interposed between a nonvolatile memory element connecting node defined as a connecting node between said input node of said first inverter circuit and said one end of said nonvolatile memory element, and an output node of said second inverter circuit, and which is on at the time of latching and writing data, and off in applying said reading signal and on after a lapse of a predetermined period of time at the time of restoring data.

2. The data holding device as recited in claim 1, further comprising a data switching gate which has an end connected to said nonvolatile memory element connecting node and the other end connected to a data transmitting path connecting said data holding circuit and the outside, and which is on at the time of transmitting data, and off while said loop switching gate is off and on after a lapse of a predetermined period of time at the time of restoring data.

3. The data holding device as recited in claim 1, further comprising a limiter element having a connecting-node-side semiconductor region connected to said nonvolatile memory element connecting node, a base semiconductor region to which is applied a power source voltage having a polarity which is the same as that of an electric charge discharged to said nonvolatile memory element connecting node by application of said reading signal, and a junction at which said connecting-node-side semiconductor region is joined to said base semiconductor region in the forward direction for said discharged electric charge.

4. The data holding device as recited in claim 3,
    wherein said loop switching gate and/or said data switching gate have a limiter field-effect transistor as said limiter element,
    said limiter field-effect element transistor having a source/drain region as said connecting-node-side semiconductor region connected to said nonvolatile memory element connecting node, a base semiconductor region to which is applied a power source voltage having a polarity which is the same as that of said electric charge discharged to said nonvolatile memory element connecting node by application of said reading signal, and a junction at which said source/drain region is joined to said base semiconductor region in the forward direction for said discharged electric charge.

5. The data holding device as recited in claim 1, further comprising a precharge circuit for discharging an electric charge in said non volatile memory element connecting node prior to said application of said reading signal.

6. The data holding device as recited in claim 5,
    wherein said nonvolatile memory element connecting node is connected to an input-side data transmitting path of data transmitting paths connecting said data holding circuit and the outside, and
    wherein one correcting inverter circuit is interposed in each of said input-side data transmitting path and an output-side data transmitting path.

7. The data holding device as recited in claim 1,
    wherein said nonvolatile memory element includes a ferroelectric capacitor, and
    wherein said nonvolatile state is the polarization state of said ferroelectric capacitor.

8. A data holding method comprising:
    a step of preparing a data holding device having a data holding circuit in which data are held by connecting first and second inverter circuits in a loop at the time of latching data, and a nonvolatile memory element having an end which is connected to an input node of said first inverter circuit at least at the time of writing and restoring data,
    said data holding circuit having a loop switching gate interposed between a nonvolatile memory element connecting node defined as a connecting node between said input node of said first inverter circuit and said one end of said nonvolatile memory element, and an output node of said second inverter circuit;
    a step of recording a nonvolatile state corresponding to data existing in said data holding circuit in said nonvolatile memory element with said one end of said nonvolatile memory element connected to said input node of said first inverter circuit at the time of writing data; and a step of restoring data corresponding to a nonvolatile state recorded in said nonvolatile memory element in said data holding circuit, including the steps of switching off said loop switching gate with the power source of said data holding device on, allowing said nonvolatile memory element to discharge an electric charge which corresponds to said nonvolatile state recorded therein and can generate a voltage higher or lower than the threshold voltage of said first inverter circuit at said input node of said first inverter circuit to said input node of said first inverter circuit by connecting said one end of said nonvolatile memory element to said input node of said first inverter circuit and applying a reading signal to the other end of said nonvolatile memory element, and connecting said first and second inverter circuits in a loop by switching on said loop switching gate after a lapse of a predetermined period of time at the time of restoring data.

9. The data holding method as recited in claim 8, wherein said data holding device has a data switching gate which has one end connected to said nonvolatile memory element connecting node and the other end connected to a data transmitting path connecting said data holding circuit and the outside, and which is on at the time of transmitting data, and wherein said step of restoring data corresponding to a nonvolatile state recorded in said nonvolatile memory element in said data holding circuit includes the steps of switching off said loop switching gate and said data switching gate with the power source of said data holding device on, allowing said nonvolatile memory element to discharge an electric charge which corresponds to said nonvolatile state recorded therein and can generate a voltage higher or lower than the threshold voltage of said first inverter circuit at said input node of said first inverter circuit to said input node of said first inverter circuit by connecting said one end of said nonvolatile memory element to said input node of said first inverter circuit and applying a reading signal to the other end of said nonvolatile memory element, connecting said first and second inverter circuits in a loop by switching on said loop switching gate with said data switching gate kept off after a lapse of a predetermined period of time, and switching on said data switching gate at the time of restoring data.

10. The data holding method as recited in claim 8, wherein said nonvolatile memory element includes a ferroelectric capacitor, and wherein said nonvolatile state is the polarization state of said ferroelectric capacitor.

11. A data holding device having a data holding circuit in which data are held by connecting two inverter circuits in a loop, comprising:

a variable resistance element interposed between a memory node of said data holding circuit and a reference potential; and a nonvolatile memory element for controlling the resistance value of said variable resistance element, wherein a state corresponding to data stored in said data holding circuit is recorded in said nonvolatile memory element, and data corresponding to a state recorded in said nonvolatile memory element are restored in said data holding circuit.

12. The data holding device as recited in claim 11, having two memory nodes, variable resistance elements interposed between said memory nodes and said reference potential, and nonvolatile memory elements provided for said variable resistance elements, respectively, for controlling the resistance values thereof.

13. The data holding device as recited in claim 11, having two memory node, a variable resistance element interposed between one of said memory nodes and said reference potential, a nonvolatile memory element for controlling the resistance value of said variable resistance element, and a resistance element interposed between the other memory node and said reference potential and having a resistance value within the resistance value of said variable resistance element.

14. The data holding device as recited in claim 12, wherein said variable resistance elements are field-effect transistors, and said nonvolatile memory elements are ferroelectric capacitors, and wherein each of said field-effect transistors has a drain and a source, either of which is connected to one of said memory nodes, and a gate electrode connected to an electrode of one of said ferroelectric capacitors, and a polarization state corresponding to data held in said data holding circuit is recorded in said ferroelectric capacitors by applying a potential of the other memory node to the other electrodes of said ferroelectric capacitors.

15. The data holding device as recited in claim 13, wherein said variable resistance element is a field-effect transistor, and said nonvolatile memory element is a ferroelectric capacitor, said field-effect transistor having a drain and a source, either of which is connected to one of said memory nodes, and a gate electrode connected to one electrode of said ferroelectric capacitor, and a polarization state corresponding to data held in said data holding circuit is recorded in said ferroelectric capacitor by applying a potential of the other memory node to the other electrode of said ferroelectric capacitor.

16. The data holding device as recited in claim 14, further comprising capacitors connected between said one of memory nodes and said gate electrode.

17. The data holding device as recited in claim 15, further comprising a capacitor connected between said one of memory nodes and said gate electrode.

18. A data holding device having a data holding circuit in which data are held by connecting two inverter circuits in a loop, comprising:

a variable resistance element interposed between a memory node of said data holding circuit and a reference potential; and a nonvolatile memory element for controlling the resistance value of said variable resistance element, wherein a state corresponding to data at optional point in time stored in said data holding circuit is recorded in said nonvolatile memory element and data corresponding to a state recorded in said nonvolatile memory element is restored in said data holding circuit.

19. The data holding device as recited in claim 18, wherein said variable resistance element is a field-effect transistor, and said nonvolatile memory element is a ferroelectric capacitor, wherein said field-effect transistor has a drain and a source, either of which is connected to said memory node, and a gate electrode connected to one of the electrodes of said ferroelectric capacitor, and, wherein a polarization state corresponding to data at an optional point in time held in said data holding circuit is recorded in said ferroelectric capacitor by applying a nonvolatile memory element writing signal to the other electrode of said ferroelectric capacitor.

20. The data holding device as recited in claim 19, having two memory nodes, wherein said drain or source of said field-effect transistor is connected to one of said memory nodes, and wherein said electrode of said ferroelectric capacitor to which a nonvolatile memory element writing signal is applied is connected to the other memory node via a nonvolatile memory element writing transistor.

21. A data holding method comprising:

a step of preparing a data holding device having a data holding circuit in which data are held by connecting two inverter circuits in a loop, a variable resistance element interposed between a memory node of said data holding circuit and a reference potential, and a nonvolatile memory element for controlling the resistance value of said variable resistance element;

a step of automatically writing data in said data holding circuit into said nonvolatile memory element;

a step in which said nonvolatile memory element holds the final data in said data holding circuit while the power source of said data holding device is off; and a step of restoring data held in said nonvolatile memory element in said data holding circuit when said power source of said data holding device is restored.

22. A data holding method comprising:

a step of preparing a data holding device having a data holding circuit in which data are held by connecting two inverter circuits in a loop, a variable resistance element interposed between a memory node of said data holding circuit and a reference potential, and a nonvolatile memory element for controlling the resistance value of said variable resistance element;

a step of writing data, at an optional point in time, in said data holding circuit into said nonvolatile memory element;

a step in which said nonvolatile memory element holds data written therein while the power source of said data holding device is off; and a step of restoring data held in said nonvolatile memory element in said data holding circuit when said power source of said data holding device is restored.

* * * * *